(12) United States Patent
Ha et al.

(10) Patent No.: US 10,879,930 B2
(45) Date of Patent: Dec. 29, 2020

(54) APPARATUS AND METHOD FOR DECODING LDPC CODES

(71) Applicants: SK hynix Inc., Gyeonggi-do (KR); Korea Advanced Institute of Science and Technology, Daejeon (KR)

(72) Inventors: Jeong Seok Ha, Daejeon (KR); Ji Eun Oh, Daejeon (KR); Dae-Sung Kim, Gyeonggi-do (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 18 days.

(21) Appl. No.: 16/237,315

(22) Filed: Dec. 31, 2018

(65) Prior Publication Data

US 2020/0036393 A1    Jan. 30, 2020

(30) Foreign Application Priority Data

Jul. 26, 2018 (KR) .......................... 10-2018-0087237

(51) Int. Cl.
*H03M 13/00* (2006.01)
*H03M 13/11* (2006.01)
*H03M 13/15* (2006.01)

(52) U.S. Cl.
CPC .... *H03M 13/1131* (2013.01); *H03M 13/1108* (2013.01); *H03M 13/1125* (2013.01); *H03M 13/1128* (2013.01); *H03M 13/1575* (2013.01)

(58) Field of Classification Search
CPC ......... H03M 13/1131; H03M 13/1108; H03M 13/1575; H03M 13/1125; H03M 13/1128
See application file for complete search history.

(56) References Cited

U.S. PATENT DOCUMENTS 9,385,753 B2    7/2016 Varnica et al.
2014/0229792 A1*   8/2014 Varnica .............. H03M 13/1108
714/759

OTHER PUBLICATIONS

Oh. J. et al., A Two-Bit Weighted Bit-Flipping Decoding Algorithm for LDPC Codes, IEEE Communications Letters, May 2018, pp. 874-877, vol. 22, No. 5, IEEE.

* cited by examiner

*Primary Examiner* — Samir W Rizk
(74) *Attorney, Agent, or Firm* — IP & T Group LLP

(57) ABSTRACT

A decoding method for a low density parity check (LDPC) code includes: updating a first check node, among a plurality of check nodes, by receiving, by the first check node, a bit decision and an associated first reliability value from each of a subset of variable nodes including a first variable node among a plurality of variable nodes, calculating a syndrome value and a second reliability value of the first check node based on the received bit decisions and first reliability values, and outputting the calculated syndrome value and second reliability value of the first check node to a variable node of the plurality of variable nodes but not of the subset of variable nodes; and updating the first variable node by receiving, by the first variable node, a syndrome value and a second reliability value of a second check node among the plurality of check nodes, and updating the first reliability value of the first variable node based on the syndrome value and the second reliability value of the second check node.

17 Claims, 15 Drawing Sheets

$$\begin{array}{c} N \\ M \leftarrow \begin{pmatrix} 1 & 1 & 1 & 0 & 1 & 0 & 0 \\ 1 & 1 & 0 & 1 & 0 & 1 & 0 \\ 1 & 0 & 1 & 1 & 0 & 0 & 1 \end{pmatrix} \end{array}$$

APPARATUS AND METHOD FOR DECODING LDPC CODES

CROSS-REFERENCE TO RELATED APPLICATION

This application claims priority under 35 U.S.C. § 119(a) to Korean Patent Application No. 10-2018-0087237, filed on Jul. 26, 2018, which is incorporated herein by reference in its entirety.

BACKGROUND

1. Field

Various embodiments of the present invention generally relate to a semiconductor device. Particularly, the embodiments relate to an operating method of a memory system.

2. Discussion of the Related Art

Recently, many studies have been conducted on LDPC codes that exhibit excellent decoding performance. Decoding methods for LDPC codes include a sum-product algorithm (SPA), a min-sum algorithm (MSA) and a bit-flipping algorithm (BFA). The SPA and the MSA use a message passing algorithm such as a belief propagation (BP) algorithm as an error correction code, and as a result their decoding performance may approach Shannon's channel capacity limit. However, a decoder using the SPA and the MSA has a problem in that the complexity of an operation required for decoding is very high. On the other hand, the BFA algorithm which is the simplest algorithm constituting an LDPC code may be implemented as a simple modular operation (modular-2 addition) by repeating a parity check operation. However, the BFA algorithm has a lower error correction ability than the BP algorithm, even though the complexity of an operation required for decoding is lower than in other algorithms. In order to solve such a problem, a weighted bit-flipping algorithm (WBFA) was proposed. The WBFA algorithm corrects an error by calculating a weight, unlike the BF algorithm.

SUMMARY

Various embodiments are directed to a decoding method for an LDPC code, which includes a decoding method for an LDPC code using a two-bit weighted bit-flipping algorithm (TB-WBFA).

In accordance with an embodiment, a decoding method for a low density parity check (LDPC) code in a memory system having a controller comprises: resetting an iteration number and first reliability values of a plurality of variable nodes; calculating hard-decision values of the plurality of variable nodes from a received signal, and deciding a hard-decision vector; transferring the hard-decision vector and the first reliability values to a plurality of check nodes; calculating syndrome values for the plurality of check nodes using the hard-decision vector, and deciding a syndrome vector value; calculating second reliability values corresponding to the syndrome values for the plurality of check nodes, when the syndrome vector value is not 0; calculating weights for the plurality of check nodes using the second reliability values; calculating flipping function values of the plurality of variable nodes using the weights; calculating a flipped flipping function value by flipping the bit of the variable node having the largest flipping function value among the flipping function values of the plurality of variable nodes; calculating a reliability function value using the flipping function value of the variable node of which the bit value is flipped; and comparing the reliability function value to a threshold value, and updating the first reliability value of the variable node of which the bit value is flipped.

In accordance with an embodiment, A decoding method for a low density parity check (LDPC) code includes: updating a first check node, among a plurality of check nodes, by receiving, by the first check node, a bit decision and an associated first reliability value from each of a subset of variable nodes including a first variable node among a plurality of variable nodes, calculating a syndrome value and a second reliability value of the first check node based on the received bit decisions and first reliability values, and outputting the calculated syndrome value and second reliability value of the first check node to a variable node of the plurality of variable nodes but not of the subset of variable nodes; and updating the first variable node by receiving, by the first variable node, a syndrome value and a second reliability value of a second check node among the plurality of check nodes, and updating the first reliability value of the first variable node based on the syndrome value and the second reliability value of the second check node.

DETAILED DESCRIPTION

Various embodiments of the invention are described below in more detail with reference to the accompanying drawings. It is noted, however, that the invention may be embodied in different forms. Moreover, aspects and features of the present invention may be configured or arranged differently than shown in the illustrated embodiments. Thus, the present invention is not to be construed as being limited to the embodiments set forth herein. Rather, the described embodiments are provided so that this disclosure is thorough and complete and fully conveys the present invention to those skilled in the art to which this invention pertains. Also, throughout the specification, reference to "an embodiment," "another embodiment" or the like is not necessarily to only one embodiment, and different references to any such phrase are not necessarily to the same embodiment(s).

Figure 1:
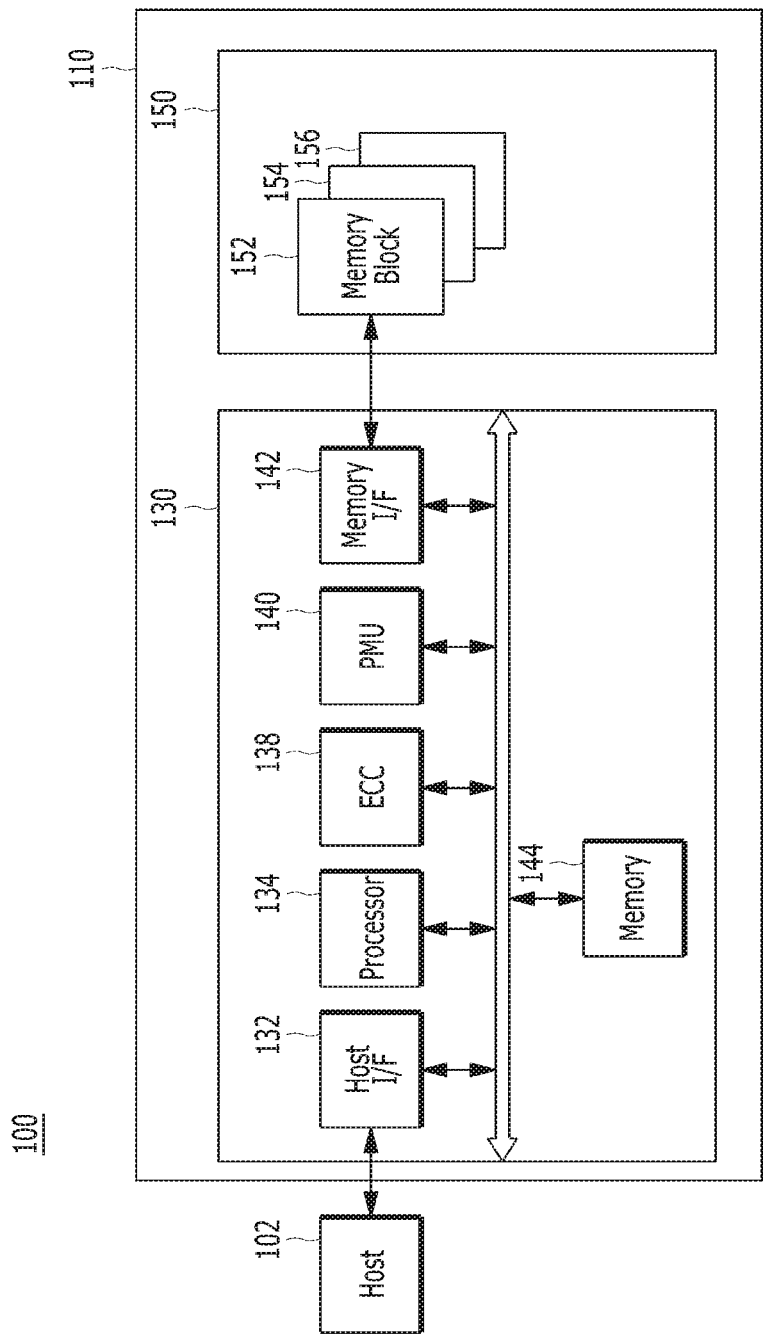
FIG. 1 is a block diagram illustrating a data processing system including a memory system in accordance with an embodiment of the present invention.

FIG. 1 is a block diagram illustrating a data processing system 100 including a memory system in accordance with an embodiment.

Referring to FIG. 1, the data processing system 100 may include a host 102 and a memory system 110.

The host 102 includes any of a variety of electronic devices, for example, portable electronic devices such as a mobile phone, an MP3 player and a laptop computer or electronic devices such as a desktop computer, a game machine, a television (TV) and a projector, that is, wired and wireless electronic devices.

Also, the host 102 includes at least one operating system (OS). The operating system generally manages and controls the functions and operations of the host 102, and provides interoperability between the host 102 and a user using the data processing system 100 or the memory system 110. The operating system supports functions and operations corresponding to the user's purpose and use of the operating system. For example, the operating system may be a general operating system or a mobile operating system depending on the mobility of the host 102. The general operating system may be a personal operating system or an enterprise operating system depending on the usage environment. For example, the personal operating system configured to support a service providing function for a general user may include Windows and Chrome, and the enterprise operating system configured to secure and support high performance may include Windows server, Linux and Unix. The mobile operating system configured to support a mobility service providing function and a system power saving function to users may include Android, iOS, Windows mobile, etc. The host 102 may include a plurality of operating systems, and executes the operating systems to perform operations with the memory system 110 in correspondence to a user request. The host 102 transmits a plurality of commands corresponding to a user request to the memory system 110, and accordingly, the memory system 110 performs operations corresponding to the commands, that is, operations corresponding to the user request.

The memory system 110 operates in response to a request of the host 102, and, in particular, stores data to be accessed by the host 102. In other words, the memory system 110 may be used as a main memory device or an auxiliary memory device of the host 102. The memory system 110 may be implemented as any one of various kinds of storage devices, depending on a host interface protocol which is coupled with the host 102. For example, the memory system 110 may be implemented as any one of a solid state driver (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

The storage devices which implement the memory system 110 may be a volatile memory device such as a dynamic random access memory (DRAM) and/or a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM) and/or a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device to form, for example, a solid state drive (SSD). In the case where the memory system 110 is used as an SSD, the operating speed of the host 102 which is coupled to the memory system 110 may be improved. Alternatively, the controller 130 and the memory device 150 may be integrated into one semiconductor device to form a memory card such as a personal computer memory card international association (PCMCIA) card, a compact flash (CF) card, a smart media card (e.g., an SM and an SMC), a memory stick, a multimedia card (e.g., an MMC, an RS-MMC and a micro-MMC), a secure digital card (e.g., an SD, a mini-SD, a micro-SD and an SDHC), and/or a universal flash storage (UFS) device.

In another embodiment, the memory system 110 may be disposed in a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may retain stored data even though power is not supplied. In particular, the memory device 150 stores the data provided from the host 102 through a write operation, and provides stored data to the host 102 through a read operation. The memory device 150 includes a plurality of memory blocks 152, 154 and 156, each of which includes a plurality of pages. Each of the pages includes a plurality of memory cells to which a plurality of word lines (WL) are coupled. Also, the memory device 150 includes a plurality of planes, each of which includes a plurality of memory blocks, e.g., blocks 152, 154 and 156. In particular, the memory device 150 may include a plurality of memory dies, each of which includes a plurality of planes. The memory device 150 may be a nonvolatile memory device, for example, a flash memory. The flash memory may have a three-dimensional (3D) stack structure.

Detailed description of the structure of the memory device 150 including the 3D stack structure is given below with reference to FIGS. 2 to 4.

The controller 130 controls the memory device 150 in response to a request from the host 102. For example, the controller 130 provides the data read from the memory device 150 to the host 102, and stores the data provided from the host 102 in the memory device 150. To this end, the controller 130 controls the operations of the memory device 150, such as read, write, program and erase operations.

The controller 130 includes a host interface (I/F) 132, a processor 134, an error correction code (ECC) component 138, a power management unit (PMU) 140, a memory interface (I/F) 142 and a memory 144.

The host interface 132 processes the commands and data of the host 102, and may be configured to communicate with the host 102 through at least one of various interface protocols such as universal serial bus (USB), multimedia card (MMC), peripheral component interconnect express (PCI-e or PCIe), serial attached SCSI (SAS), serial advanced technology attachment (SATA), parallel advanced technology attachment (PATA), small computer system interface (SCSI), enhanced small disk interface (ESDI), integrated drive electronics (IDE) and mobile industry processor interface (MIPI). The host interface 32 may be driven through firmware referred to as a host interface layer (HIL), which is a region which exchanges data with the host 102.

The ECC component 138 corrects an error bit of the data processed in the memory device 150, and may include an ECC encoder and an ECC decoder. The ECC encoder may encode data to be programmed in the memory device 150 and generate data added with parity bits. The data added with parity bits may be stored in the memory device 150. The ECC decoder detects and corrects an error included in the data read from the memory device 150, in the case of reading the data stored in the memory device 150. That is to say, after performing error correction decoding for the data read from the memory device 150, the ECC component 138 may determine whether the error correction decoding has succeeded, output an indication signal depending on a determination result, for example, an error correction success/failure signal, and correct an error bit of the read data by using the parity bits generated in the ECC encoding process. The ECC component 138 may be unable to correct error bits when above a correctable error bit limit, in which case the ECC component 138 may output an error correction fail signal indicating that it is incapable of correcting the error bits.

The ECC component 138 may perform error correction by using a low density parity check (LDPC) code, a Bose, Chaudhuri, Hocquenghem (BCH) code, a turbo code, a Reed-Solomon (RS) code, a convolution code, a recursive systematic code (RSC), trellis-coded modulation (TCM) or Block coded modulation (BCM). The error correction, however, is not limited to these techniques. As such, the ECC component 138 may include any and all circuits, modules, systems or devices for suitable error correction.

The PMU 140 provides and manages power for the controller 130, that is, power for the component elements included in the controller 130.

The memory interface 142 serves as a memory and storage interface which performs interfacing between the controller 130 and the memory device 150, to allow the controller 130 to control the memory device 150 in response to a request from the host 102. The memory interface 142 generates control signals for the memory device 150 and processes data according to the control of the processor 134, as a NAND flash controller (NFC) in the case where the memory device 150 is a flash memory, in particular, a NAND flash memory. The memory interface 142 may support the operation of an interface which processes a command and data between the controller 130 and the memory device 150, for example, a NAND flash interface, in particular, data input/output between the controller 130 and the memory device 150. The memory interface 142 may be driven through firmware referred to as a flash interface layer (FIL), which is a region which exchanges data with the memory device 150.

The memory 144, as the working memory of the memory system 110 and the controller 130, stores data for driving of the memory system 110 and the controller 130. For example, when the controller 130 controls the memory device 150 in response to a request from the host 102, the controller 130 may provide data read from the memory device 150 to the host 102, and/or store data provided from the host 102 in the memory device 150. To this end, when the controller 130 controls the operations of the memory device 150, such as read, write, program and erase operations, the memory 144 stores data needed to allow such operations to be performed by the memory system 110, that is, between the controller 130 and the memory device 150.

The memory 144 may be realized by a volatile memory. For example, the memory 144 may be realized by a static random access memory (SRAM) or a dynamic random access memory (DRAM). Furthermore, the memory 144 may disposed within the controller 130 as shown in FIG. 1. Alternatively, the memory 144 may external to the controller 130, and in this regard, may be realized as a separate external volatile memory in communication with the controller 130 through a memory interface.

As described above, the memory 144 stores data needed to perform data read and write operations between the host 102 and the memory device 150 and data when performing the data read and write operations. For such data storage, the memory 144 includes a program memory, a data memory, a write buffer/cache, a read buffer/cache, a data buffer/cache, a map buffer/cache, and the like.

The processor 134 controls the entire operations of the memory system 110, and in particular, controls a program operation or a read operation for the memory device 150, in response to a write request or a read request from the host 102. The processor 134 drives a firmware referred to as a flash translation layer (FTL), to control the general operations of the memory system 110. The processor 134 may be realized by a microprocessor or a central processing unit (CPU).

For instance, the controller 130 performs an operation requested from the host 102, in the memory device 150, that is, performs a command operation corresponding to a command received from the host 102, with the memory device 150, through the processor 134. The controller 130 may perform a foreground operation as a command operation corresponding to a command received from the host 102, for example, a program operation corresponding to a write command, a read operation corresponding to a read command, an erase operation corresponding to an erase command or a parameter set operation corresponding to a set parameter command or a set feature command as a set command.

The controller 130 may also perform a background operation for the memory device 150, through the processor 134. The background operation for the memory device 150 includes an operation of copying the data stored in one memory block, among the memory blocks 152, 154 and 156 of the memory device 150, to another memory block. Such a background operation may be a garbage collection (GC) operation, an operation of swapping the memory blocks 152, 154 and 156 or data stored therein, e.g., a wear leveling (WL) operation, an operation of storing map data stored in the controller 130 in the memory blocks 152, 154 and 156, e.g., a map flush operation, or an operation of performing bad block management for the memory device 150, for example, an operation of identifying and processing a bad block among the memory blocks 152, 154 and 156 in the memory device 150.

A management unit (not shown) for performing bad block management for the memory device 150 may be included in the processor 134 of the controller 130. The management unit identifies a bad block in the plurality of memory blocks 152, 154 and 156 in the memory device 150, and then, performs bad block management of processing the bad block and labeling it as bad. The bad block management, in the case where the memory device 150 is a flash memory, for example, a NAND flash memory, is used when a program fail may occur when performing data write, for example, data program, due to the characteristic of the NAND flash memory. A memory block where the program fail has occurred is processed and labeled as a bad block, and program-failed data are written, that is, programmed, in a new memory block. Moreover, in the case where the memory device 150 has a 3-dimensional stack structure as described above, if a corresponding block is processed as a bad block according to a program fail, because the utilization efficiency of the memory device 150 and the reliability of the memory system 110 may deteriorate abruptly, it is necessary to reliably perform bad block management. A memory device in the memory system in accordance with embodiments of the present disclosure is described below in detail with reference to FIGS. 2 to 4.

Figure 2:
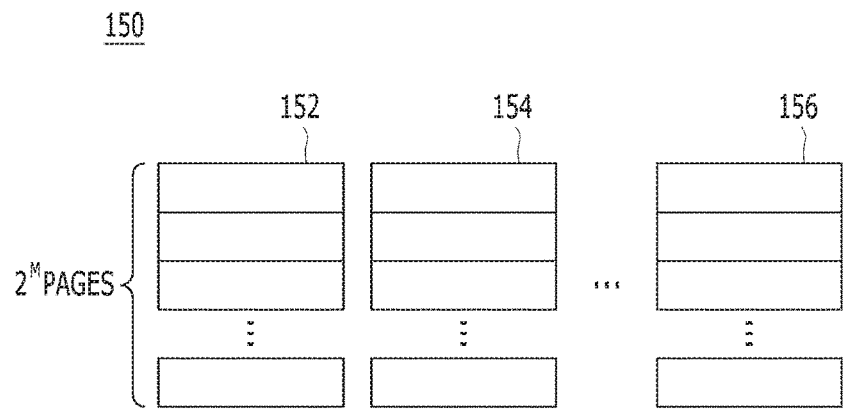
FIG. 2 is a schematic diagram illustrating an exemplary configuration of a memory device employed in the memory system shown in FIG. 1.
Figure 3:
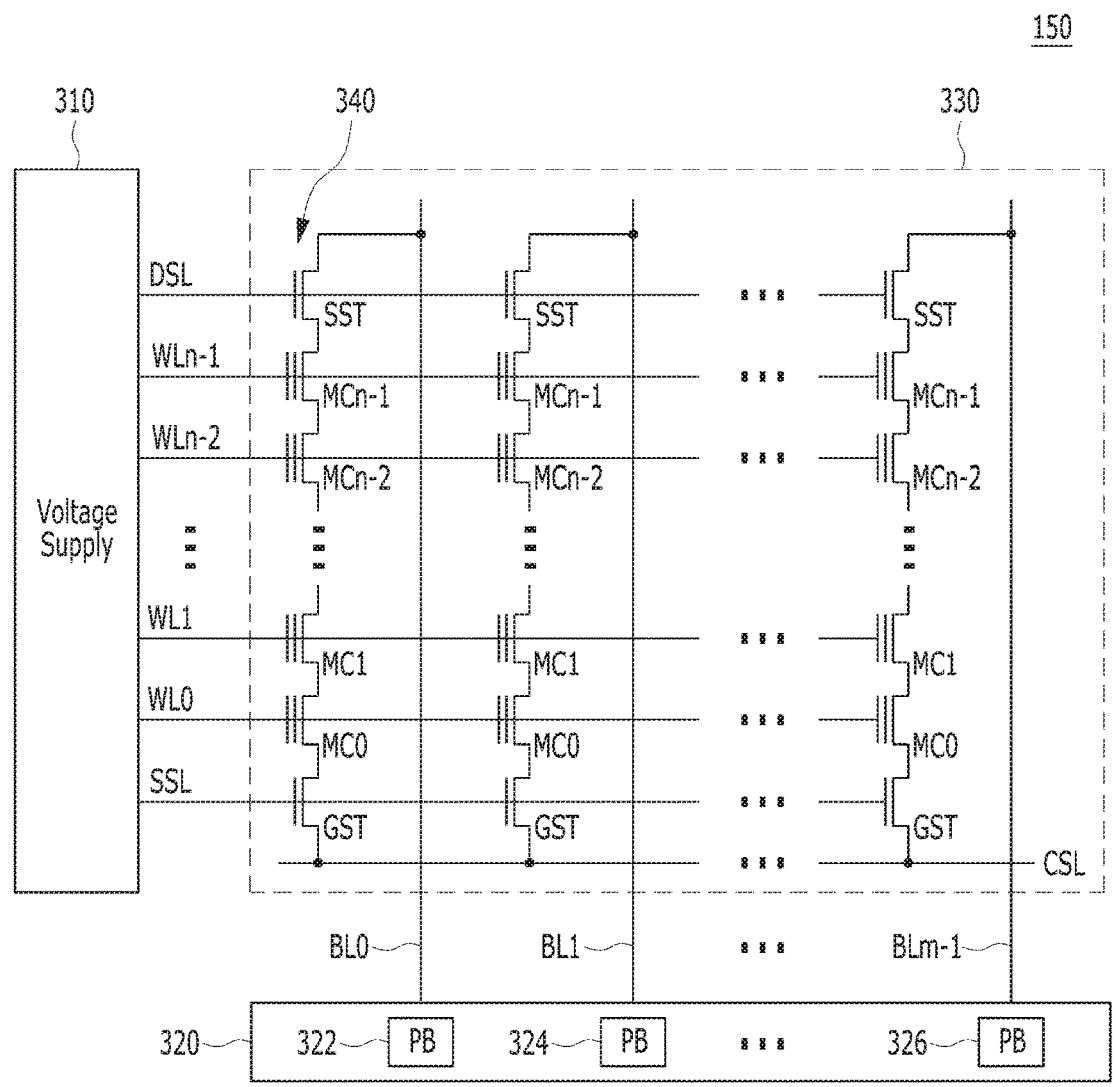
FIG. 3 is a circuit diagram illustrating an exemplary configuration of a memory cell array of a memory block in the memory device shown in FIG. 2.
Figure 4:
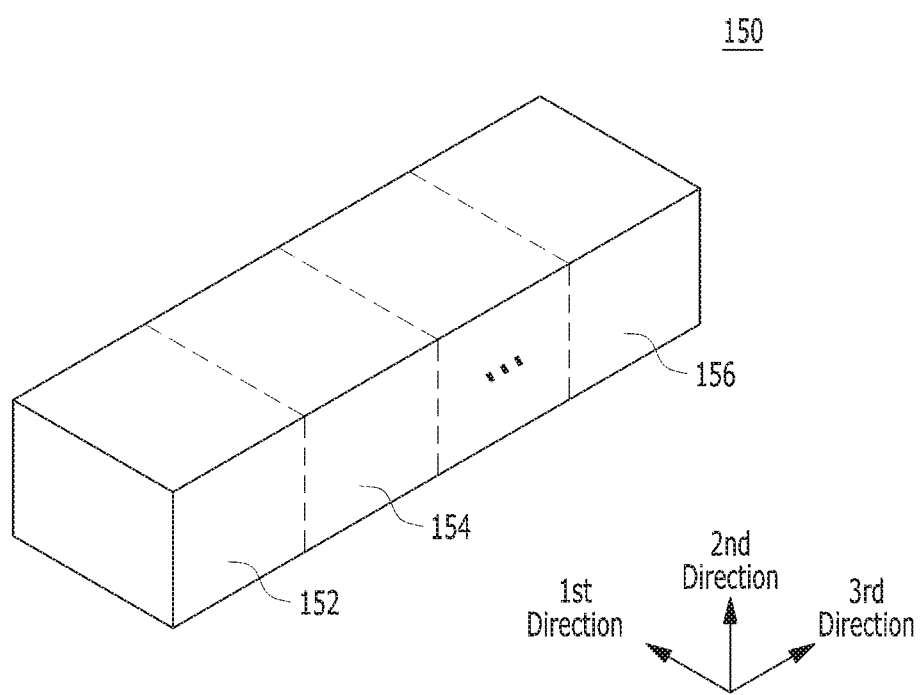
FIG. 4 is a schematic diagram illustrating an exemplary three-dimensional structure of the memory device shown in FIG. 2.

FIG. 2 is a diagram illustrating a memory device in a memory system, FIG. 3 is a diagram illustrating a memory cell array circuit of a memory block in a memory device, and FIG. 4 is a diagram illustrating a structure of a 3-dimensional nonvolatile memory device.

Referring to FIG. 2, the memory device 150 includes a plurality of memory blocks 152, 154 and 156 includes a plurality of pages, for example, $2^M$ or M pages. Each of the pages includes a plurality of memory cells to which a plurality of word lines (WL) are coupled.

The memory device 150 may include single level cell (SLC) memory blocks and/or multi-level cell (MLC) memory blocks, depending on the number of bits to be stored in or expressed by one memory cell. An SLC memory block includes a plurality of pages which are realized by memory cells each storing 1 bit, and has high data calculation performance and high durability. An MLC memory block includes a plurality of pages which are realized by memory cells each storing multi-bit data (for example, 2 or more bits), and has a larger data storage space than the SLC memory block, that is, is capable of being highly integrated. In particular, the memory device 150 may include, as MLC memory blocks, an MLC memory block including a plurality of pages which are realized by memory cells each capable of storing 2-bit data, a triple level cell (TLC) memory block including a plurality of pages which are realized by memory cells each capable of storing 3-bit data, a quadruple level cell (QLC) memory block including a plurality of pages which are realized by memory cells each capable of storing 4-bit data, or a multiple level cell memory block including pages which are realized by memory cells each capable of storing 5 or more-bit data.

While it is described as an example that the memory device 150 is realized by a nonvolatile memory such as a flash memory, for example, a NAND flash memory, it is noted that the memory device 150 may be implemented as any of multiple types of memories such as a phase change memory (i.e., phase change random access memory (PCRAM)), a resistive memory (i.e., resistive random access memory (RRAM or ReRAM)), a ferroelectric memory (i.e., ferroelectric random access memory (FRAM)) and a spin transfer torque magnetic memory (i.e., spin transfer torque magnetic random access memory (STT-RAM or STT-MRAM)).

Each of the memory blocks 15 stores the data provided from the host 102 of FIG. 1 through a write operation, and provides stored data to the host 102 through a read operation.

Referring to FIG. 3, memory block 330 is representative of any of memory blocks 152, 154, 156 in the memory device 150 of the memory system 110. Each memory block 330 may include a plurality of cell strings 340 which are realized as a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors SST and DST. The respective memory cells MC0 to MCn−1 may be constructed by multi-level cells (MLC) each of which stores data or information of a plurality of bits. The cell strings 340 may be electrically coupled to corresponding bit lines BL0 to BLm−1, respectively.

While FIG. 3 shows, as an example, each memory block 330 constructed by NAND flash memory cells, it is noted that each of the plurality of memory blocks 152,154,156 is not limited to a NAND flash memory and may be realized by a NOR flash memory, a hybrid flash memory in which at least two kinds of memory cells are combined, or a one-NAND flash memory in which a controller is built in a memory chip. The memory device 150 may be realized as not only a flash memory device in which a charge storing layer is constructed by conductive floating gates but also a charge trap flash (CTF) memory device in which a charge storage layer is constructed by a dielectric layer.

A voltage supply circuit 310 of the memory device 150 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply circuit 310 may be performed by the control of a control circuit (not shown). The voltage supply circuit 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 150 is controlled by a control circuit (not shown), and may operate as a sense amplifier or a write driver according to an operation mode. In a verify/normal read operation, the read/write circuit 320 may operate as a sense amplifier for reading data from the memory cell array. In a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines). A plurality of latches (not shown) may be included in each of the page buffers 322, 324 and 326.

The memory device 150 may be realized as a 2-dimensional or 3-dimensional memory device. In particular, as shown in FIG. 4, the memory device 150 may be realized as a nonvolatile memory device with a three-dimensional stack structure. In the case where the memory device 150 is realized as a three-dimensional structure, the memory device 150 may include a plurality of memory blocks BLK0 to BLKN−1.

FIG. 4 illustrates the memory blocks 152, 154 and 156 of the memory device 150 shown in FIG. 1. Each of the memory blocks 152, 154 and 156 may be realized as a 3-dimensional structure (or a vertical structure). For example, the respective memory blocks 152, 154 and 156 may be realized as a 3-dimensional structure which extends in first to third directions, for example, the x-axis direction, the y-axis direction and the z-axis direction.

Each memory block 330 may include a plurality of NAND strings NS which extend in the second direction. The plurality of NAND strings NS may be provided in the first direction and the third direction. Each NAND string NS may be coupled to a bit line BL, at least one string select line SSL, at least one ground select line GSL, a plurality of word lines WL, at least one dummy word line DWL and a common source line CSL, and may include a plurality of transistor structures TS.

Namely, each memory block 330 may be coupled to a plurality of bit lines BL, a plurality of string select lines SSL, a plurality of ground select lines GSL, a plurality of word lines WL, a plurality of dummy word lines DWL and a plurality of common source lines CSL, and accordingly, may include a plurality of NAND strings NS. Also, in each memory block 330, a plurality of NAND strings NS may be coupled to one bit line BL, and a plurality of transistors may be realized in one NAND string NS. A string select transistor SST of each NAND string NS may be coupled to a corresponding bit line BL, and a ground select transistor GST of each NAND string NS may be coupled to the common source line CSL. Memory cells MC may be provided between the string select transistor SST and the ground select transistor GST of each NAND string NS. Namely, a plurality of memory cells may be realized in each memory block 330.

Figures 5, 6:
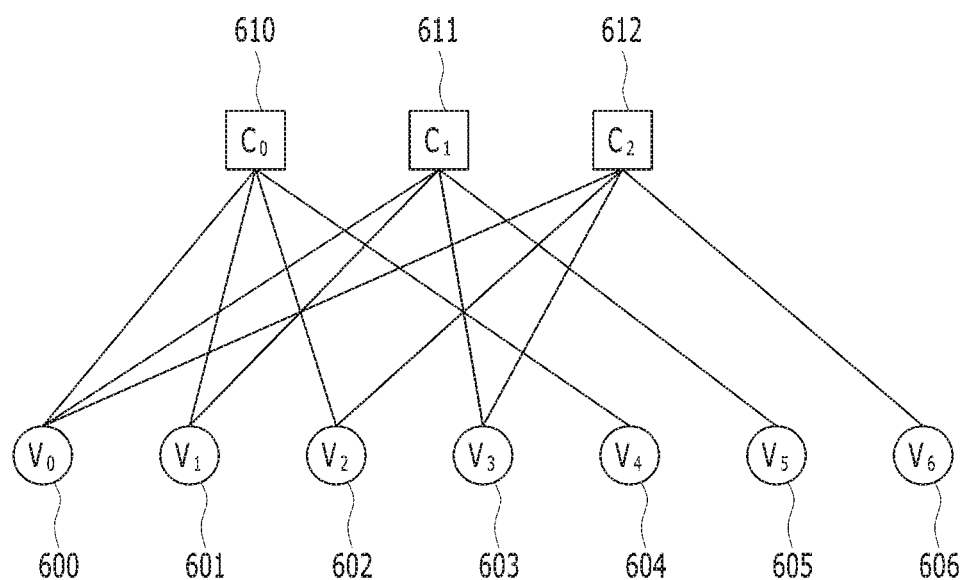
FIG. 5 illustrates an example of a parity check matrix of an LDPC code in accordance with an embodiment.
FIG. 6 illustrates a Tanner graph corresponding to the parity check matrix H 100 in accordance with an embodiment.

FIG. 5 illustrates an example of a parity check matrix of an LDPC code in accordance with an embodiment.

In general, an LDPC code may be defined as a parity check matrix H 100, which may be expressed as an M×N matrix. In the parity check matrix H 100, M may represent the number of parity check equations as the number of rows, and N may represent the length of a codeword as the number of columns. In this context, the parity check matrix H 100 may be expressed as Equation 1 below.

$$H=[h_{mn}] \text{ for } m \in [1,M] \text{ and } n \in [1,N] \qquad \text{[Equation 1]}$$

The parity check matrix H 100 of the LDPC code may be characterized in that the number of high logic values, e.g., 1's, is smaller than the number of low logic values, e.g., 0's.

Referring to FIG. 5, the parity check matrix H 100 of the LDPC code may be composed of three rows and seven columns. Since the parity check matrix H 100 has seven columns, the parity check matrix H 100 may indicate an LDPC code for generating a codeword with a length of 7. The respective columns may correspond to encoded seven bits.

FIG. 6 illustrates a Tanner graph corresponding to the parity check matrix H 100 in accordance with an embodiment.

Referring to FIG. 6, the LDPC code may be expressed as a factor graph which is commonly called a Tanner graph. In the factor graph vortexes constituting the graph are of two different types which represent variable nodes and check nodes respectively. The variable nodes may correspond one-to-one to encoded bits. In the factor graph, the nodes may be connected through edges. Here, the edges may be decided by the positions of elements which are not 0 in the parity check matrix. When a check node m and a variable node n are connected through an edge, an element $h_{mn}$ in the matrix 100 may have a value which is not '0'. Furthermore, the number of edges connected to a specific node may be referred to as the degree ($d_v$, $d_c$) of the node. When the variable node degree $d_v$ of each column is constant and the check node degree $d_c$ of each row is constant, the LDPC code may be referred as a regular LDPC code. On the other hand, when the variable node degree $d_v$ and the check node degree $d_c$ are not constant, the LDPC code may be referred to as an irregular LDPC code.

Based on such a configuration, the factor graph of the LDPC code in FIG. 6 may be composed of the plurality of variable nodes and the plurality of check nodes. For example, the plurality of variable nodes may include zeroth to sixth variable nodes 600 to 606, which may indicate the columns of the parity check matrix H 100. The plurality of check nodes may include zeroth to second check nodes 610 to 612, which may indicate the rows of the parity check matrix H. For example, when the zeroth check node ($c_0$) 610 and the third variable node ($v_3$) 603 are connected through an edge, the corresponding element of the parity check matrix may have a value which is not 0.

Furthermore, a decoder using a two-bit weighted bit-flipping algorithm (TB-WBFA) may perform decoding by exchanging messages through edges connecting variable nodes and check nodes. The decoding process performed in each of the nodes may be referred to as node update. In all of the iteration processes, each of the nodes may exchange messages with neighboring nodes connected to the corresponding node through edges, using a message received in the previous iteration process. That is, a message from a variable node to a check node may include a bit-decision $\hat{u}_n$ of an $n^{th}$ variable node and a first reliability value $q_n$ of the bit-decision $\hat{u}_n$ of the $n^{th}$ variable node. The first reliability value $q_n$ may be expressed as a single bit, and the bit value may be expressed as '1' when the reliability of the bit-decision $\hat{u}_n$ of the variable node is low, and expressed as '0' when the reliability is high.

Next, a message from a check node to a variable node may include a syndrome value $s_m$ of an $m^{th}$ check node and a second reliability value $r_{mn}$ for the syndrome value $s_m$ of the $m^{th}$ check node.

The reliability values are not assumed from a channel; rather, the reliability values are calculated by decoding.

Figure 7:
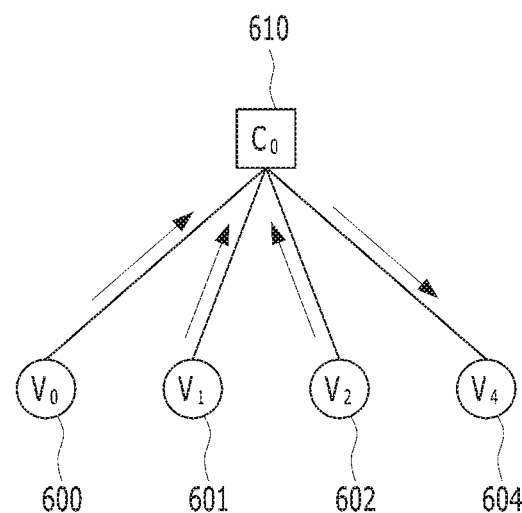
FIG. 7 illustrates an example of check node update in FIG. 6.

FIG. 7 illustrates an example of check node update in FIG. 6. In FIG. 7, the zeroth check node $c_0$ 610 among the plurality of check nodes will be described by way of example.

Referring to FIG. 7, the zeroth check node $c_0$ 610 may receive the bit-decisions $\hat{u}_n$ and the first reliability values $q_n$ from the zeroth variable node $v_0$, the first variable node $v_1$ and the second variable node $v_2$. The zeroth check node $c_0$ 610 may calculate the syndrome value $s_m$ and the second reliability value $r_{mn}$ using the bit-decisions $\hat{u}_n$ and the first reliability values $q_n$, received from the respective variable nodes, and output the calculated syndrome value $s_m$ and second reliability value $r_{mn}$ to the fourth variable node $v_4$.

Figure 8:
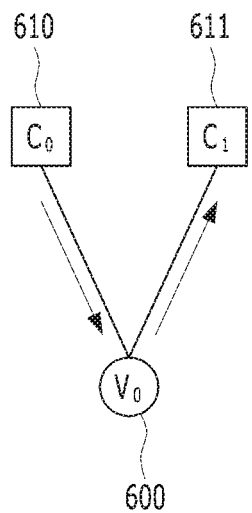
FIG. 8 illustrates an example of variable node update in FIG. 6.

FIG. 8 illustrates an example of variable node update in FIG. 6. In FIG. 8, the zeroth variable node among the plurality of variable nodes is described by way of example.

Referring to FIG. 8, the zeroth variable node $v_0$ may receive the syndrome value $s_m$ and the second reliability value $r_{mn}$ from the zeroth check node $c_0$. The zeroth variable node $v_0$ may update the first reliability value $q_n$ and the bit value through the syndrome value $s_m$ and the second reliability value $r_{mn}$, received from the zeroth check node $c_0$, and output the updated first reliability value $q_n$ and bit value to the first check node $c_1$.

Figure 9:
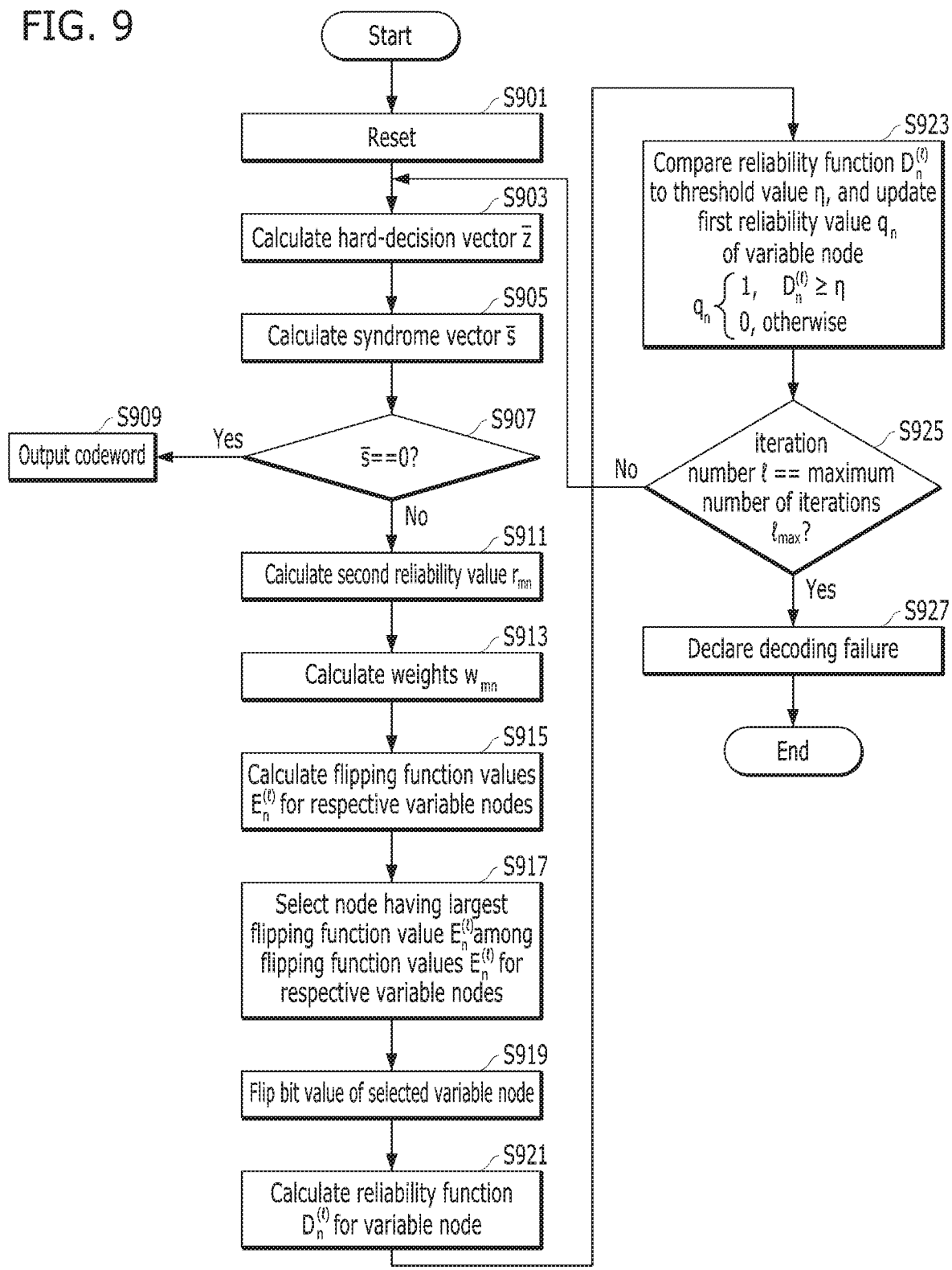
FIG. 9 is a flowchart illustrating a decoding method for LDPC codes based on a TB-WBFA in accordance with an embodiment.

FIG. 9 is a flowchart illustrating a decoding method for LDPC codes based on a TB-WBFA in accordance with an embodiment.

In the decoding method for LDPC codes based on the TB-WBFA in FIG. 9, a receiver may include a decoder which decodes and detects an LDPC code through a bit-flipping decoding method for updating the reliability of a variable node.

At step S901, the decoder may reset an iteration number for performing a decoding operation, a maximum number of iterations, a set of variable nodes to be flipped, bit-decisions of variable nodes, first reliability values, second reliability values, and flipping function values. For example, the decoder may reset the iteration number l to 1, and arbitrarily set the maximum number of iterations $l_{max}$, during a reset operation. The set B of variable nodes to be flipped may be reset to an empty set. The bit-decisions $\hat{u}_n$ of the variable nodes may be reset to hard-decision values $z_n$ received from a channel. The first and second reliability values $q_n$ and $r_{mn}$ may be reset as follows. The first reliability value $q_n$ transferred from a variable node to a check node and the second reliability value $r_{mn}$ transferred from a check node to a variable node may be expressed as '1' when the reliability is low, or expressed as '0' when the reliability is high. In the present embodiment, the first and second reliability values $q_n$ and $r_{mn}$ may be reset to '1'. The flipping function value $E_n$ may be reset to 0. As such, the reset values in the algorithm in accordance with the present embodiment may be expressed as Equation 2 below.

$$l=1, B=\emptyset, \hat{u}_n=z_n, q_n=1, r_{mn}=1, E_n=0.$$ [Equation 2]

At step S903, the decoder may calculate the hard-decision values $z_n$ through a signal $y_n$ received from a binary symmetric channel (BSC), and decide a hard-decision vector $\bar{Z}$. The hard-decision values $z_n$ may be calculated as expressed as Equation 3 below.

$$z_n = 0, \quad y_n < 0$$ [Equation 3]

$$z_n = 1, \quad \text{else where}$$

When the LDPC code is decoded based on the TB-WBFA, the hard-decision values $z_n$ of 0 or 1 may be calculated because a signal decided as 0 or 1 is decoded. Then, the hard-decision vector $\bar{z}=[z_1, z_2, \ldots, z_n]$ may be decided through the calculated hard-decision value $z_n$.

At step S905, the decoder may calculate a syndrome vector $\bar{s}=([s_1, s, \ldots, s_n]$ using the hard-decision vector $\bar{z}$, according to Equation 4.

$$\bar{s} = \bar{z} H^T$$ [Equation 4]

In order to calculate the syndrome vector, the decoder needs to calculate the respective syndrome values of the plurality of check nodes. The syndrome values $s_m$ of the respective check nodes may be calculated according to Equation 5, where $s_m$ represents the syndrome value of the $m^{th}$ check node.

$$s_m = \sum_{n \in N(m)} \hat{u}_n H_{mn} (\text{mod } 2)$$ [Equation 5]

In Equation 5, $H_{mn}$ represents the element at the $m^{th}$ row and the $n^{th}$ column, which is not 0, in the parity check matrix of the LDPC code, that is, a value of 1. Furthermore, $N(m)$ represents a set of variable nodes connected to the $m^{th}$ check node, and is defined as Equation 6.

$$N(m) = \{n | H_{mn} \neq 0, 0 \leq n \leq N\}, 0 \leq m \leq M$$ [Equation 6]

At step S907, the decoder may check whether or not the calculated syndrome vector values $\bar{s}=[s_1, s, \ldots, s_n]$) of all the check nodes are 0.

When the check result at step S907 indicates that the syndrome vector values is 0 (Y), the decoder may stop the decoding operation, output the bit-decision $\bar{u}$ of the decoder as a codeword, and successfully end the decoding operation, at step S909.

However, when the check result at step S907 indicates that the syndrome vector value $\bar{s}$ is not a zero vector (N), the decoder may calculate the second reliability value $r_{mn}$ corresponding to the plurality of syndrome values $s_1, s, \ldots, s_n$ at step S911. That is, the decoder may calculate the second reliability value $r_{mn}$ of the syndrome value $s_m$ for the $m^{th}$ check node, calculated through Equation 5, and transfer the second reliability value $r_{mn}$ to the $n^{th}$ variable node. The second reliability value $r_{mn}$ of the syndrome value $s_m$ may be calculated as expressed as Equation 7.

$$r_{mn} = \begin{cases} 1, & \sum_{n' \in N(m) \setminus n} q_{n'} \geq 1 \\ 0, & \text{otherwise} \end{cases}$$ [Equation 7]

In Equation 7, n' represents the other variable nodes excluding the $n^{th}$ variable node, among a plurality of variable nodes connected to the $m^{th}$ check node, in order to calculate the second reliability value $r_{mn}$ transferred from the $m^{th}$ check node to the $n^{th}$ variable node. Furthermore, $$\sum_{n' \in N(m) \setminus n} q_{n'} \geq 1$$

and $r_{mn}$ represent a value obtained by performing an OR operation on the first reliability values $q_{n'}$ which the $m^{th}$ check node receives from the other variable nodes excluding the $n^{th}$ variable node.

At step S913, the decoder may calculate weights $w_{mn}$ for the plurality of variable nodes connected to the $m^{th}$ check node using the calculated second reliability value $r_{mn}$ according to Equation 8, based on the TB-WBFA.

$$w_{mn} = \begin{cases} \alpha_s & \text{for } r_{mn} = 0 \\ \alpha_w & \text{for } r_{mn} = 1 \end{cases}$$ [Equation 8]

In Equation 8, $\alpha_s$ and $\alpha_w$ represent weight factors which are determined according to the reliability values for the syndrome values. For example, $\alpha_w$ may be fixed to 1, and $\alpha_s$ may be decided through Equation 9.

$$\alpha_s = 2 \cdot (d_v - 1) \qquad \text{[Equation 9]}$$

When $\alpha_s$ is calculated as expressed as Equation 9, the number of steps for $D_n$ may be increased the most, thereby contributing to a performance improvement.

At step S915, the decoder may calculate flipping function values $E_n^{(l)}$ for the plurality of variable nodes connected to the $m^{th}$ check node, using the weights $w_{mn}$, and the flipping function values may be expressed as Equation 10 below.

$$E_n^{(l)} = \sum_{m \in M(n)} w_{mn}(2s_m - 1), \qquad \text{[Equation 10]}$$

At step S917, the decoder may select the variable node having the largest flipping function value $E_n^{(l)}$ among the plurality of calculated flipping function values $E_n^{(l)}$, and represent the selected variable node as a set B as expressed as Equation 11 below.

$$B = \left\{ n \mid n = \arg\max_n E_n^{(l)} \right\} \qquad \text{[Equation 11]}$$

At step S919, the decoder may flip the bit value of the variable node included in the set B. The decoder may update the flipping function value $-E_n^{(l)}$ of the variable node of which the bit value was flipped, as expressed as Equation 12.

$$E_n^{(l)} \leftarrow -E_n^{(l)} \text{ for } \forall n \in B \qquad \text{[Equation 12]}$$

At step S921, the decoder may store the flipping function value $E_n^{(l)}$ for the variable node in a reliability function $D_n^{(l)}$, and the reliability function $D_n^{(l)}$ may be expressed as Equation 13 below.

$$D_n^{(l)} = E_n^{(l)} + E_n^{(l-1)} \qquad \text{[Equation 13]}$$

Here, $E_n^{(l-1)}$ represents the previous flipping function value. When $l=1$, $E_n^{(0)}$ has a value of 0. The decoder may reflect the previous flipping function value $E_n^{(l-1)}$ into the reliability function $D_n^{(l)}$ by adding the previous flipping function value $E_n^{(l-1)}$ and the current flipping function value $E_n^{(l)}$. Furthermore, since the flipping function value $E_n^{(l)}$ of the present algorithm is a value to which its weight is applied and a flipping function value $E_n^{(l)}$ of a general bit-flipping algorithm is a value to which its weight is applied, the flipping function value $E_n^{(l)}$ of the present algorithm may have a wider range than the range in which the flipping function value $E_n^{(l)}$ of the general bit-flipping algorithm is included. That is, since the flipping function value of the bit-flipping algorithm is $E_n^{(l)} = \Sigma(2s_m - 1)$, the range of the flipping function is limited to integer values in a relation of $-d_v \le E_n \le d_v$. On the other hand, since the flipping function value of the TB-WBFA is $E_n^{(l)} = \Sigma w_{mn}(2s_m - 1)$, the range of the flipping function value $E_n^{(l)}$ may be diversified by the weight variable $w_{mn}$. When the range of the flipping function value $E_n^{(l)}$ of the TB-WBFA is diversified, it may indicate that the reliabilities of the respective variable nodes can be divided into more ranges, which leads to an improvement of the final decoding performance.

At step S923, the decoder may compare the reliability function value $D_n^{(l)}$, in which the flipping function value is stored, to a threshold value $\eta$, and calculate the first reliability value $q_n$ from a variable node to a check node. That is, when the reliability function value $D_n^{(l)}$ is larger than the threshold value $\eta$, the first reliability value $q_n$ may be calculated as 1. On the other hand, when the reliability function value $D_n^{(l)}$ is smaller than the threshold value $\eta$, the first reliability value $q_n$ may be calculated as 0. This may be expressed as Equation 14 below.

$$q_n = \begin{cases} 1, & D_n^{(l)} \ge \eta \\ 0, & \text{otherwise} \end{cases} \qquad \text{[Equation 14]}$$

$$\eta = \begin{cases} \eta_0, & \ell = 1 \\ \eta_1, & \ell > 1 \end{cases}$$

In Equation 14, the reason why the threshold value $\eta$ for distinguishing the reliability function value $D_n^{(l)}$ is divided into the case in which the number of iterations is 1 and the case in which the number of iterations is equal to or more than 2 is as follows. When the number of iterations is 1, the number of iterations is not present because no flipping function value has been previously calculated. Therefore, the reliability function value becomes $D_n^{(1)} = E_n^{(1)}$. On the other hand, when the number of iterations is equal to or more than 2, the reliability function value becomes $D_n^{(l)} = E_n^{(l)} + E_n^{(l-1)}$. Thus, the threshold value for distinguishing the reliability function value $D_n^{(l)}$ may be divided into two values, depending on the number of iterations.

Furthermore, when $l=1$, $\eta_0$ may be expressed as Equation 15 below.

$$+(d_v - 2) \cdot \alpha_w - 2\alpha_w < \eta_0 < +(d_v - 1) \cdot \alpha_w - \alpha_w \qquad \text{[Equation 15]}$$

When $l > 1$, $\eta_1$ may be decided as a value to minimize the weighted sum of conditional decision error probabilities, and expressed as Equation 16 below. The weighted sum of conditional decision error probabilities has a property of a convex function, and there is the value of $\eta_1$ that minimizes the weighted sum of conditional decision error probabilities.

$$\min_{\eta_1} \beta Pr[q_n = 0 \mid n \in \mathcal{N}_e, DF] + \qquad \text{[Equation 16]}$$

$$(1 - \beta) Pr[q_n = 1 \mid n \in \mathcal{N}_c, DF] =$$

$$\min_{\eta_1} \beta Pr[D_n > \eta_1 \mid n \in \mathcal{N}_e, DF] +$$

$$(1 - \beta) Pr[D_n < \eta_1 \mid n \in \mathcal{N}_c, DF]$$

Here, $\mathcal{N}_e$ represents a set of variable nodes which are errors, and $\mathcal{N}_c$ represents a set of variable nodes which are not errors. DF represents decoding failure, and $\eta_1$ is set to $\eta_0$ ($\eta_1 = \eta_0$), which indicates decoding failure event during decoding.

At step S925, the decoder may check whether the iteration number P is equal to the maximum number of iterations $l_{max}$. When the check result indicates that the iteration number l is equal to the maximum number of iterations $l_{max}$ (Y), the decoder may declare decoding failure in step S927, and end the decoding. On the other hand, when the iteration number l is not equal to the maximum number of iterations $l_{max}$ (N), the decoder may add 1 to the iteration number l (l=l+1) and return to step S903 to perform a decoding operation.

Figure 10:
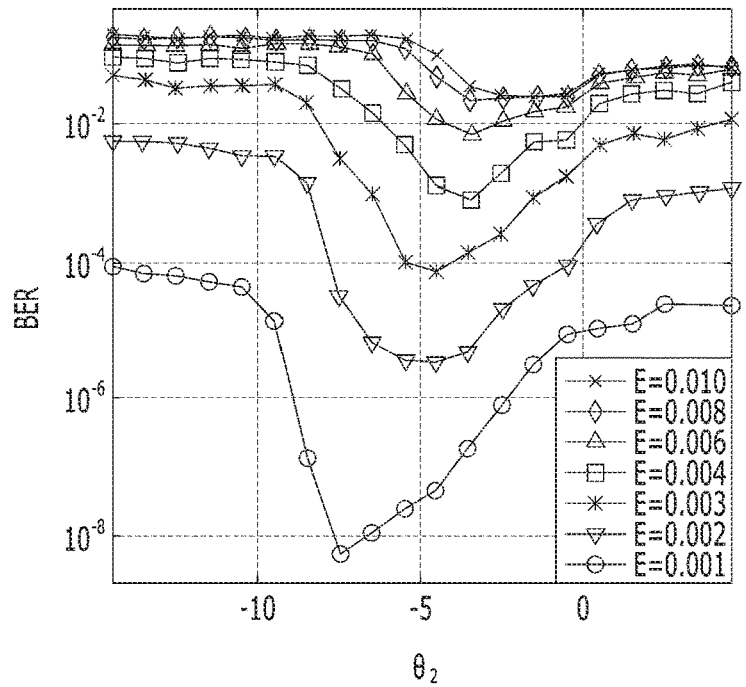
FIG. 10 is a graph for deciding the threshold value in accordance with an embodiment.

FIG. 10 is a graph for deciding the threshold value in accordance with an embodiment.

FIG. 10 illustrates a graph to decide the threshold value $\eta$ for distinguishing the reliability of the reliability function $D_n$ among variable nodes to optimize the TB-WBFA, showing the weighted sum of conditional decision error probabilities. Since the weighted sum of conditional decision error probabilities has a property of a convex function, it may indicate that there is a threshold value to minimize the weighted sum of conditional decision error probabilities.

Figure 11:
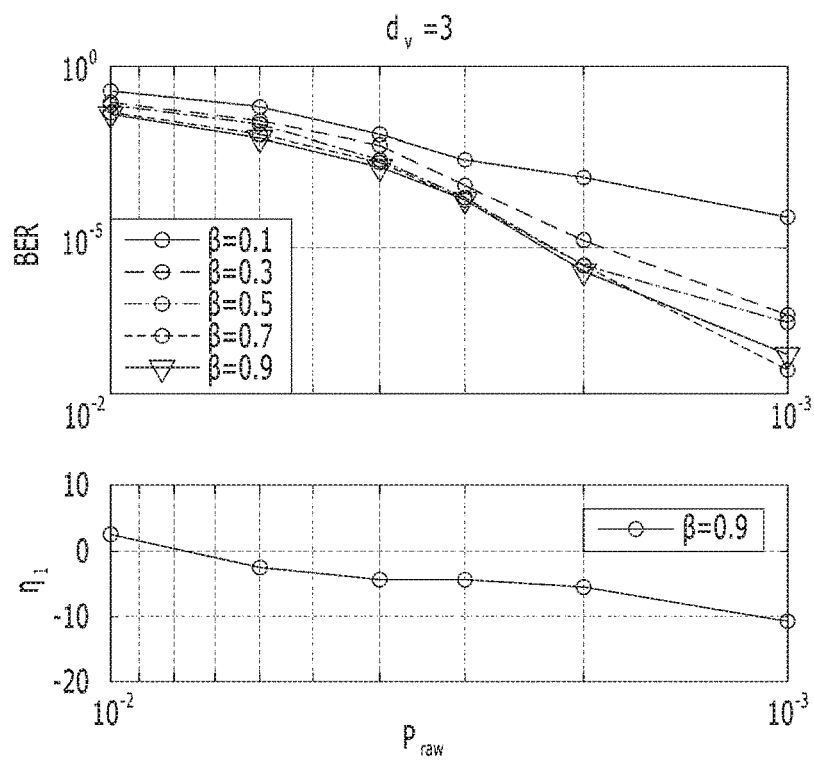
FIGS. 11 and 12 are graphs illustrating results obtained by evaluating the performance of the decoder in accordance with an embodiment.
Figure 12:
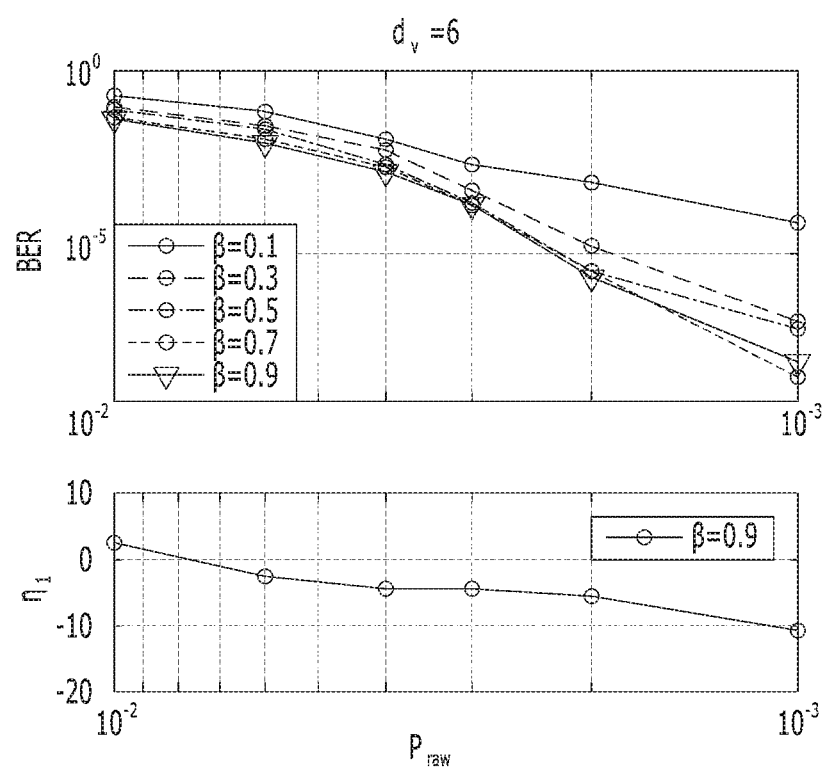

FIGS. 11 and 12 are graphs illustrating results obtained by evaluating the performance of the decoder in accordance with an embodiment. FIGS. 11 and 12 are graphs illustrating results obtained by evaluating the performance of the TB-WBFA while changing the weight β of a conditional decision error probability. FIG. 11 shows a result obtained by evaluating the performance of the TB-WBFA at an LDPC code where $d_v=3$. FIG. 12 shows a result obtained by evaluating the performance of the TB-WBFA at an LDPC code where $d_v=6$. FIGS. 11 and 12 show that the optimal value of the weight is 0.9.

Figure 13:
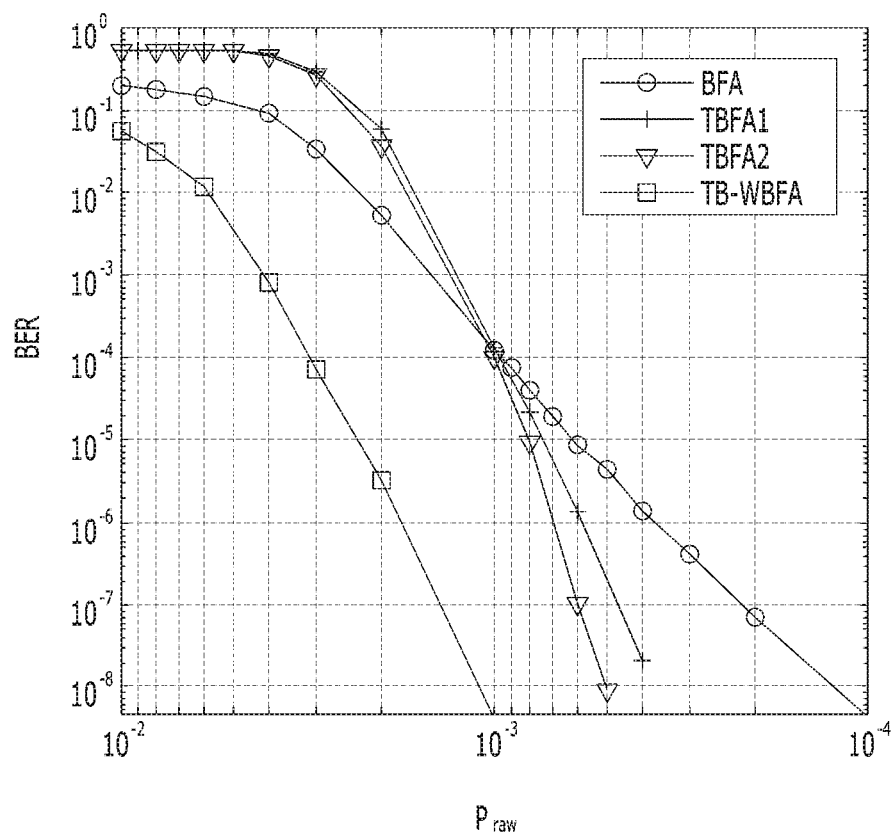
FIGS. 13 and 14 are graphs illustrating the bit error rate (BER) performances of the decoder based on the TB-WBFA in accordance with an embodiment.
Figure 14:
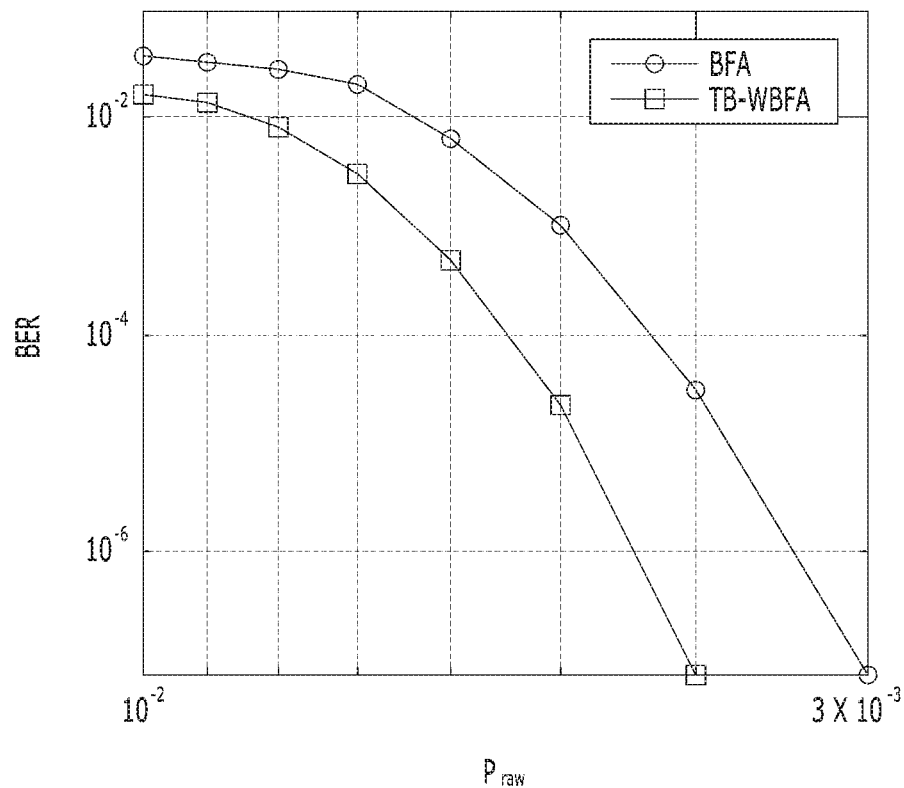

FIGS. 13 and 14 are graphs illustrating the bit error rate (BER) performances of the decoder based on the TB-WBFA in accordance with an embodiment.

FIG. 13 comparatively shows the bit error rate performance of the TB-WBFA in accordance with an embodiment and the bit error rate performances of the BFA and the TBFA according to the related art, when the variable node degree is 3 ($d_v=3$) and the check node degree is 27 ($d_c=27$). Referring to FIG. 13, the bit error rate performance of the decoder based on the TB-WBFA exhibits a performance gain of two to four orders of magnitude over the BFA and the TBFA according to the related art.

FIG. 14 comparatively shows the bit error rate performance of the TB-WBFA in accordance with an embodiment and the bit error rate performances of the WBFA according to the related art, when the variable node degree is 6 ($d_v=6$) and the check node degree is 54 ($d_c=54$). Referring to FIG. 14, the bit error rate performance of the decoder based on the TB-WBFA exhibits a performance gain of two to four orders of magnitude over the WBFA according to the related art.

With reference to FIGS. 15 to 23, a data processing system and electronic appliances, to which the memory system 110 including the memory device 150 and the controller 130 described above, may be applied, in accordance with embodiments, are described.

Figure 15:
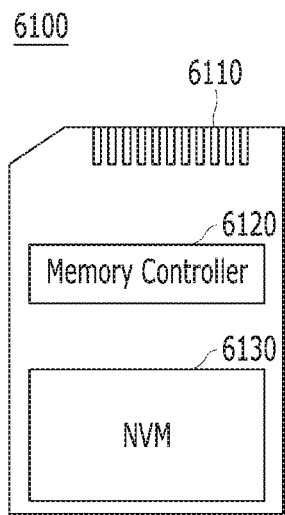
FIGS. 15 to 23 are diagrams schematically illustrating application examples of the data processing system shown in FIG. 1 in accordance with various embodiments of the present invention.

FIG. 15 is a diagram illustrating a data processing system including a memory system in accordance with an embodiment. FIG. 15 illustrates a memory card system 6100 to which the memory system is applied.

Referring to FIG. 15, the memory card system 6100 includes a connector 6110, a memory controller 6120 and a memory device 6130.

The memory controller 6120 is connected with, for access to, the memory device 6130, which is implemented as a nonvolatile memory (NVM. For example, the memory controller 6120 controls the read, write, erase and background operations of the memory device 6130. The memory controller 6120 provides an interface between the memory device 6130 and a host (not shown), and drives firmware for controlling the memory device 6130. That is to say, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processor, a host interface, a memory interface and an error correction component.

The memory controller 6120 may communicate with an external device, for example, the host 102 described above with reference to FIG. 1, through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), advanced technology attachment (ATA), serial ATA, parallel ATA, small computer system interface (SCSI), enhanced small disk interface (ESDI), integrated drive electronics (IDE), Firewire, universal flash storage (UFS), WiFi or Wi-Fi and Bluetooth. Accordingly, the memory system and the data processing system may be applied to wired and/or wireless electronic appliances, particularly a mobile electronic appliance.

The memory device 6130 may be implemented by a nonvolatile memory such as an electrically erasable and programmable ROM (EPROM), a NAND flash memory, a NOR flash memory, a phase-change RAM (PRAM), a resistive RAM (ReRAM), a ferroelectric RAM (FRAM) and/or a spin torque transfer magnetic RAM (STT-MRAM).

The controller 6120 and the memory device 6130 may be integrated into one semiconductor device to form a solid state drive (SSD), or a memory card such as a PC card (e.g., personal computer memory card international association (PCMCIA)), a compact flash card (CF), a smart media card (e.g., SM and SMC), a memory stick, a multimedia card (e.g., MMC, RS-MMC, MMCmicro and eMMC), a secure digital (SD) card (e.g., SD, miniSD, microSD and SDHC) or a universal flash storage (UFS).

Figure 16:
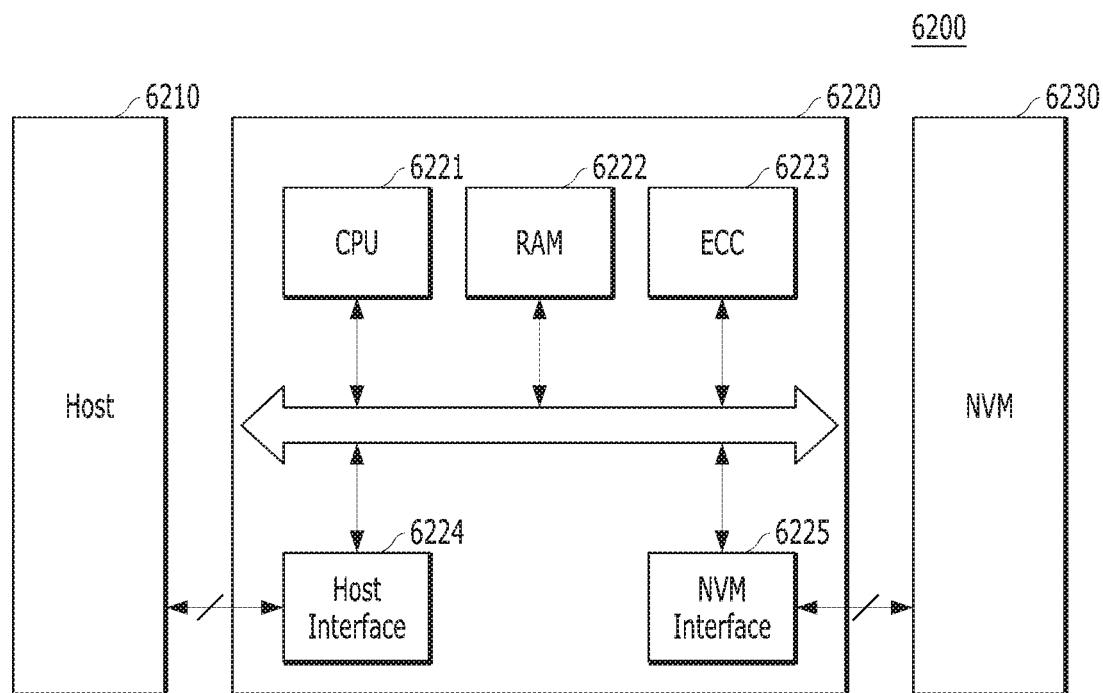

FIG. 16 is a diagram illustrating a data processing system 6200 including a memory system in accordance with an embodiment.

Referring to FIG. 16, the data processing system 6200 includes a memory device 6230 which is implemented by at least one nonvolatile memory (NVM) and a memory controller 6220 which controls the memory device 6230. The data processing system 6200 may be a storage medium such as a memory card (e.g., CF, SD and microSD). The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 controls read, write and erase operations for the memory device 6230 in response to requests from a host 6210. The memory controller 6220 includes at least one CPU 6221, a buffer memory, for example, a RAM 6222, an ECC circuit 6223, a host interface 6224, and a memory interface, for example, an NVM interface 6225.

The CPU 6221 may control general operations for the memory device 6230, for example, read, write, file system management, bad page management, and the like. The RAM 6222 operates according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 to operate at a high speed.

The ECC circuit 6223 corresponds to the ECC component 138 of the controller 130 described above with reference to FIG. 1. As described above with reference to FIG. 1, the ECC circuit 6223 generates an error correction code (ECC) for correcting a failed bit or an error bit in the data received from the memory device 6230. Also, the ECC circuit 6223 performs error correction encoding for data to be provided to the memory device 6230, and generates data with added parity bits. The parity bits may be stored in the memory device 6230. The ECC circuit 6223 may perform error correction decoding for data outputted from the memory device 6230. The ECC circuit 6223 may correct errors by using the parity bits. For example, as described above with reference to FIG. 1, the ECC circuit 6223 may correct errors by using any of various coded modulations such as an LDPC code, a BCH code, a turbo code, a Reed-Solomon code, a convolution code, an RSC, a TCM and a BCM.

The memory controller 6220 exchanges data with the host 6210 through the host interface 6224, and exchanges data with the memory device 6230 through the NVM interface 6225. The host interface 6224 may be connected with the host 6210 through a PATA bus, a SATA bus, an SCSI, a USB, a PCIe or a NAND interface. Further, as a wireless communication function or a mobile communication protocol such as WiFi or long term evolution (LTE) is implemented, the memory controller 6220 may transmit and receive data by being connected with an external device, for example, the host 6210 or another external device. Specifically, as the memory controller 6220 is configured to communicate with an external device through at least one among various communication protocols, the memory system and the data processing system may be applied to wired and/or wireless electronic appliances, particularly a mobile electronic appliance.

Figure 17:
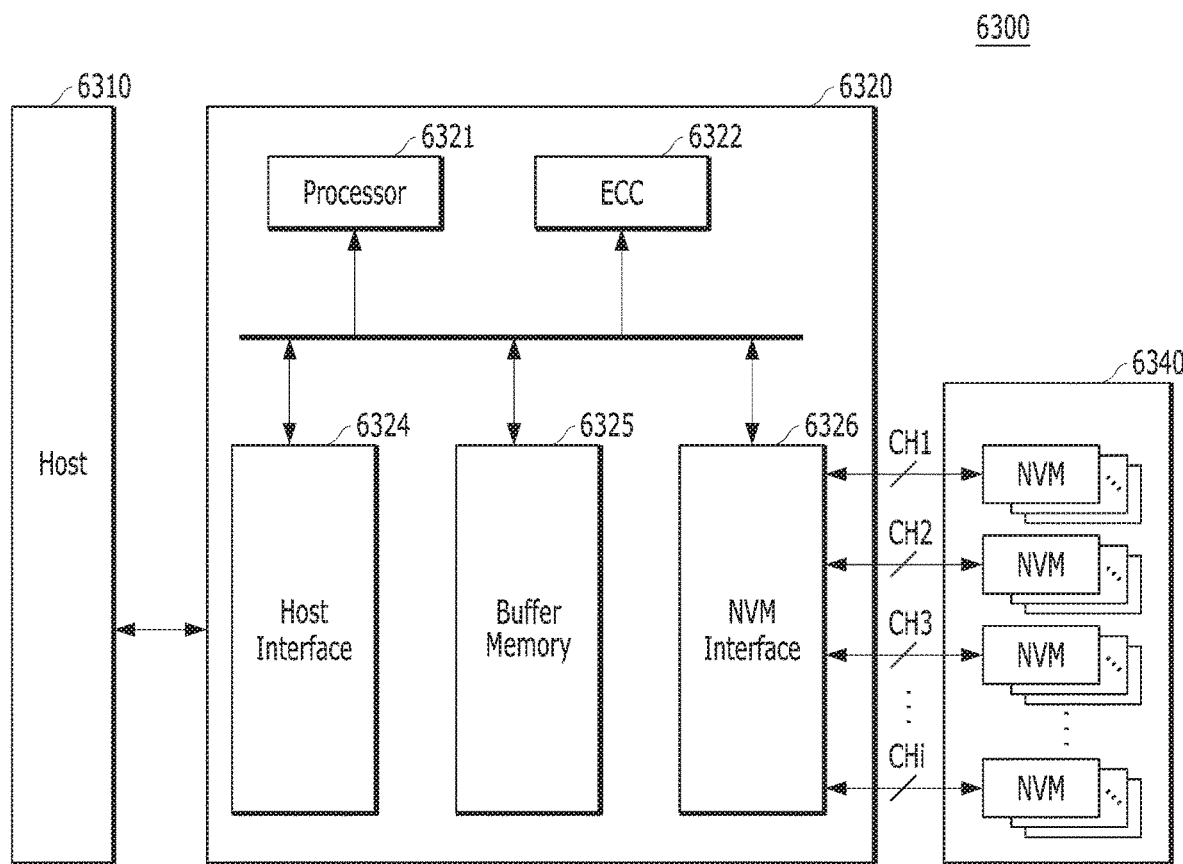

FIG. 17 is a diagram illustrating a data processing system including a memory system in accordance with an embodiment. FIG. 17 illustrates a solid state drive (SSD) 6300 to which the memory system is applied.

Referring to FIG. 17, the SSD 6300 includes a controller 6320 and a memory device 6340 which includes a plurality of nonvolatile memories (NVM). The controller 6320 may correspond to the controller 130 in the memory system 110 described above with reference to FIG. 1, and the memory device 6340 may correspond to the memory device 150 in the memory system 110 described above with reference to FIG. 1.

The controller 6320 is connected with the memory device 6340 through a plurality of channels CH1, CH2, CH3, . . . and CHi. The controller 6320 includes at least one processor 6321, an ECC circuit 6322, a host interface 6324, a buffer memory 6325, and a memory interface, for example, a nonvolatile memory interface 6326.

The buffer memory 6325 temporarily stores data received from a host 6310 or data received from a plurality of flash memories NVMs included in the memory device 6340, or temporarily stores metadata of the plurality of flash memories NVMs, for example, map data including mapping tables. The buffer memory 6325 may be realized by a volatile memory such as, but not limited to, a DRAM, an SDRAM, a DDR SDRAM, an LPDDR SDRAM and a GRAM or a nonvolatile memory such as, but not limited to, an FRAM, an ReRAM, an STT-MRAM and a PRAM. While it is illustrated in FIG. 13 that the buffer memory 6325 is disposed inside the controller 6320, the buffer memory 6325 may be disposed external to the controller 6320.

The ECC circuit 6322 calculates error correction code values of data to be programmed in the memory device 6340 in a program operation. The ECC circuit 6322 performs an error correction operation for data read from the memory device 6340, based on the error correction code values, in a read operation. The ECC circuit 6322 performs an error correction operation for data recovered from the memory device 6340 in a recovery operation for failed data.

The host interface 6324 provides an interface function with respect to an external device, for example, the host 6310, and the nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system, for example, a redundant array of independent disks (RAID) system may be implemented. In the RAID system, the plurality of SSDs 6300 and a RAID controller for controlling the plurality of SSDs 6300 may be included. In the case of performing a program operation by receiving a write command from the host 6310, the RAID controller may select at least one memory system, that is, at least one SSD 6300, in correspondence to the RAID level information of the received write command received, among a plurality of RAID levels, that is, the plurality of SSDs 6300, and may output data corresponding to the write command to the selected SSD 6300. Also, in the case of performing a read operation by receiving a read command from the host 6310, the RAID controller may select at least one memory system, that is, at least one SSD 6300, in correspondence to the RAID level information of the received read command, among the plurality of RAID levels, that is, the plurality of SSDs 6300, and may provide data outputted from the selected SSD 6300 to the host 6310.

Figure 18:
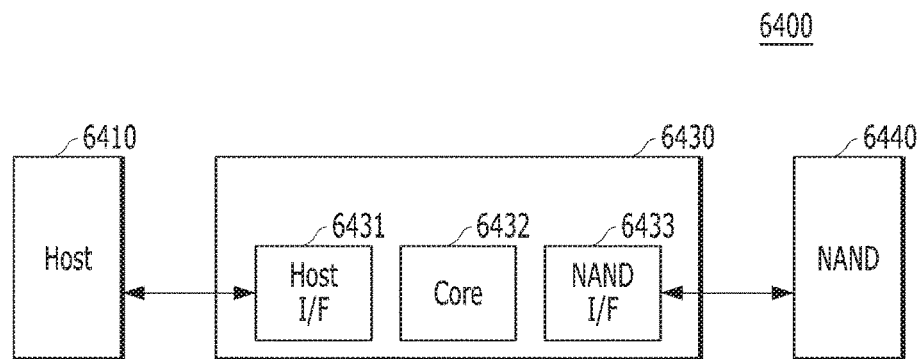

FIG. 18 is a diagram illustrating a data processing system including a memory system in accordance with an embodiment. FIG. 18 illustrates an embedded multimedia card (eMMC) 6400 to which the memory system is applied.

Referring to FIG. 18, the eMMC 6400 includes a controller 6430 and a memory device 6440 which is implemented by at least one NAND flash memory. The controller 6430 may correspond to the controller 130 in the memory system 110 described above with reference to FIG. 1, and the memory device 6440 may correspond to the memory device 150 in the memory system 110 described above with reference to FIG. 1.

The controller 6430 is connected with the memory device 6440 through a plurality of channels. The controller 6430 includes at least one core 6432, a host interface (I/F) 6431, and a memory interface, i.e., a NAND interface (I/F) 6433.

The core 6432 controls general operations of the eMMC 6400. The host interface 6431 provides an interface function between the controller 6430 and a host 6410. The NAND interface 6433 provides an interface function between the memory device 6440 and the controller 6430. For example, the host interface 6431 may be a parallel interface, for example, an MMC interface, as described above with reference to FIG. 1, and may be a serial interface, for example, a ultra high speed (UHS)-I/UHS-II and a UFS interface.

FIGS. 19 to 22 are diagrams illustrating examples of data processing systems including a memory system in accordance with embodiments. Each of FIGS. 19 to 22 illustrates a universal flash storage (UFS) to which the memory system is applied.

Referring to FIGS. 19 to 22, respective UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The respective hosts 6510, 6610, 6710 and 6810 may be wired and/or wireless electronic appliances, in particular, application processors of mobile electronic appliances or the likes. The respective UFS devices 6520, 6620, 6720 and 6820 may be embedded UFS devices. The respective UFS cards 6530, 6630, 6730 and 6830 may be external embedded UFS devices or removable UFS cards.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with external devices, for example, wired and/or wireless electronic appliances, in particular, mobile electronic appliances or the likes, through UFS protocols. The UFS devices 6520, 6620, 6720 and 6820 and the UFS cards 6530, 6630, 6730 and 6830 may be implemented as the memory system 110 described above with reference to FIG. 1. For example, in the respective UFS systems 6500, 6600, 6700 and 6800, the UFS devices 6520, 6620, 6720 and 6820 may be implemented in the form of the data processing system 6200, the SSD 6300 or the eMMC 6400 described above with reference to FIGS. 16 to 18, and the UFS cards 6530, 6630, 6730 and 6830 may be implemented in the form of the memory card system 6100 described above with reference to FIG. 15.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may perform communication through the universal flash storage (UFS) interface, for example, MIPI M-PHY and MIPI Unified Protocol (UniPro) in Mobile Industry Processor Interface (MIPI). The UFS devices 6520, 6620, 6720 and 6820 and the UFS cards 6530, 6630, 6730 and 6830 may perform communication through another protocol other than the UFS protocol, for example, various card protocols such as universal storage bus (USB) Flash Drives (UFDs), multi-media card (MMC), secure digital (SD), mini SD and Micro SD.

Figure 19:
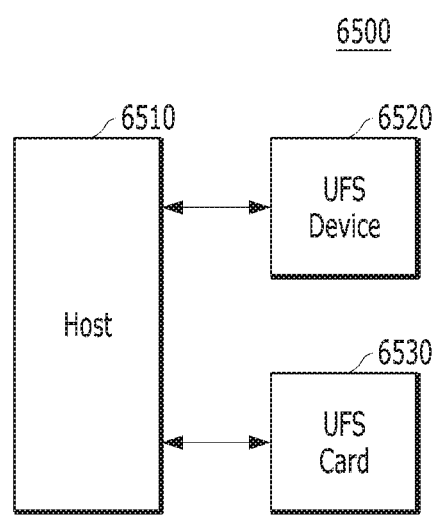
Figure 20:
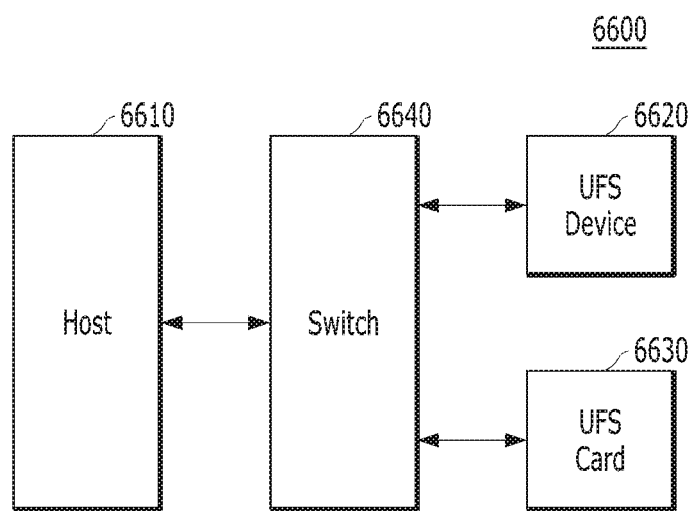

In the UFS system 6500 shown in FIG. 19, UniPro exists in each of the host 6510, the UFS device 6520 and the UFS card 6530. The host 6510 performs a switching operation to perform communication with each of the UFS device 6520 and the UFS card 6530. In particular, the host 6510 performs communication with the UFS device 6520 or the UFS card 6530, through link layer switching in UniPro, for example, L3 switching. The UFS device 6520 and the UFS card 6530 may perform communication through link layer switching in the UniPro of the host 6510. While it is described as an example that one UFS device 6520 and one UFS card 6530 are coupled to the host 6510, it is noted that a plurality of UFS devices and a plurality of UFS cards may be coupled to the host 6510 in a parallel or a star type arrangement. Also, a plurality of UFS cards may be coupled to the UFS device 6520 in any of a parallel, a star, a serial or a chain type arrangement.

In the UFS system 6600 shown in FIG. 19, UniPro exists in each of the host 6610, the UFS device 6620 and the UFS card 6630. The host 6610 performs communication with the UFS device 6620 or the UFS card 6630 through a switching module 6640 which performs a switching operation, in particular, a switching module 6640 which performs link layer switching in UniPro, for example, an L3 switching operation. The UFS device 6620 and the UFS card 6630 may perform communication through link layer switching in the UniPro of the switching module 6640. While it is described as an example that one UFS device 6620 and one UFS card 6630 are coupled to the switching module 6640, it is noted that a plurality of UFS devices and a plurality of UFS cards may be coupled to the switching module 6640 in a parallel type or a star type arrangement. Also, a plurality of UFS cards may be coupled to the UFS device 6620 in any of a parallel, a star, a serial or a chain type arrangement.

Figure 21:
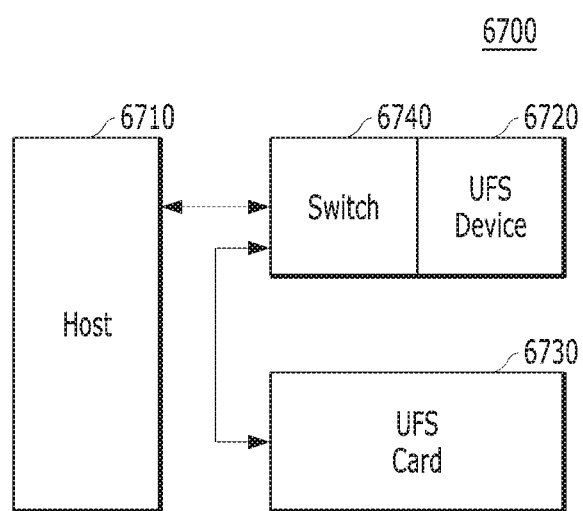

In the UFS system 6700 shown in FIG. 21, UniPro exists in each of the host 6710, the UFS device 6720 and the UFS card 6730. The host 6710 performs communication with the UFS device 6720 or the UFS card 6730 through a switching module 6740 which performs a switching operation, in particular, the switching module 6740 which performs link layer switching in UniPro, for example, an L3 switching operation. The UFS device 6720 and the UFS card 6730 may perform communication through link layer switching in the UniPro of the switching module 6740. The switching module 6740 may be implemented as one module with the UFS device 6720 inside or outside the UFS device 6720. While it is described as an example that one UFS device 6720 and one UFS card 6730 are coupled to the switching module 6740, it is noted that a plurality of modules in which the switching module 6740 and the UFS device 6720 are respectively implemented may be coupled to the host 6710 in a parallel type or a star type arrangement. Also, respective modules may be coupled in a serial type or a chain type arrangement, or a plurality of UFS cards may be coupled to the switching module 6740 in a parallel type or a star type arrangement.

Figure 22:
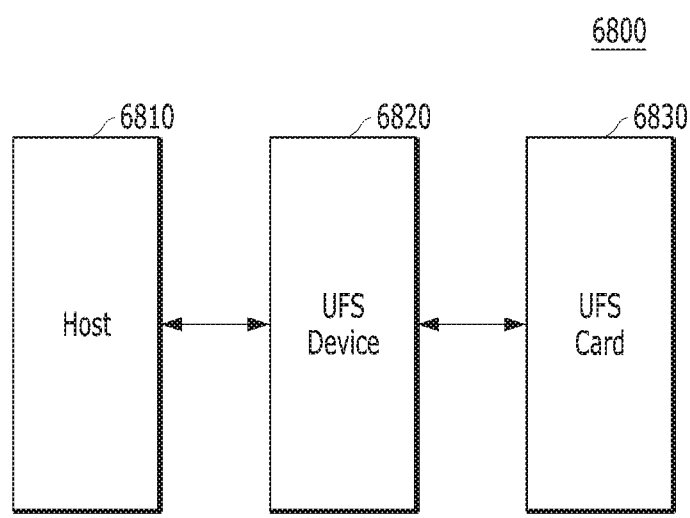

In the UFS system 6800 shown in FIG. 22, M-PHY and UniPro exist in each of the host 6810, the UFS device 6820 and the UFS card 6830. The UFS device 6820 performs a switching operation to perform communication with the host 6810 and the UFS card 6830. In particular, the UFS device 6820 performs communication with the host 6810 or the UFS card 6830, through switching between M-PHY and UniPro modules for communication with the host 6810 and M-PHY and UniPro modules for communication with the UFS card 6830, for example, target identifier (ID) switching. The host 6810 and the UFS card 6830 may perform communication through target ID switching between M-PHY and UniPro modules of the UFS device 6820. While it is described as an example that one UFS device 6820 is coupled to the host 6810 and one UFS card 6830 is coupled to one UFS device 6820, it is noted that a plurality of UFS devices may be coupled to the host 6810 in a parallel type or a star type arrangement. Also, a plurality of UFS cards may be coupled to one UFS device 6820 in any of a parallel, a star, a serial, or a chain type arrangement.

Figure 23:
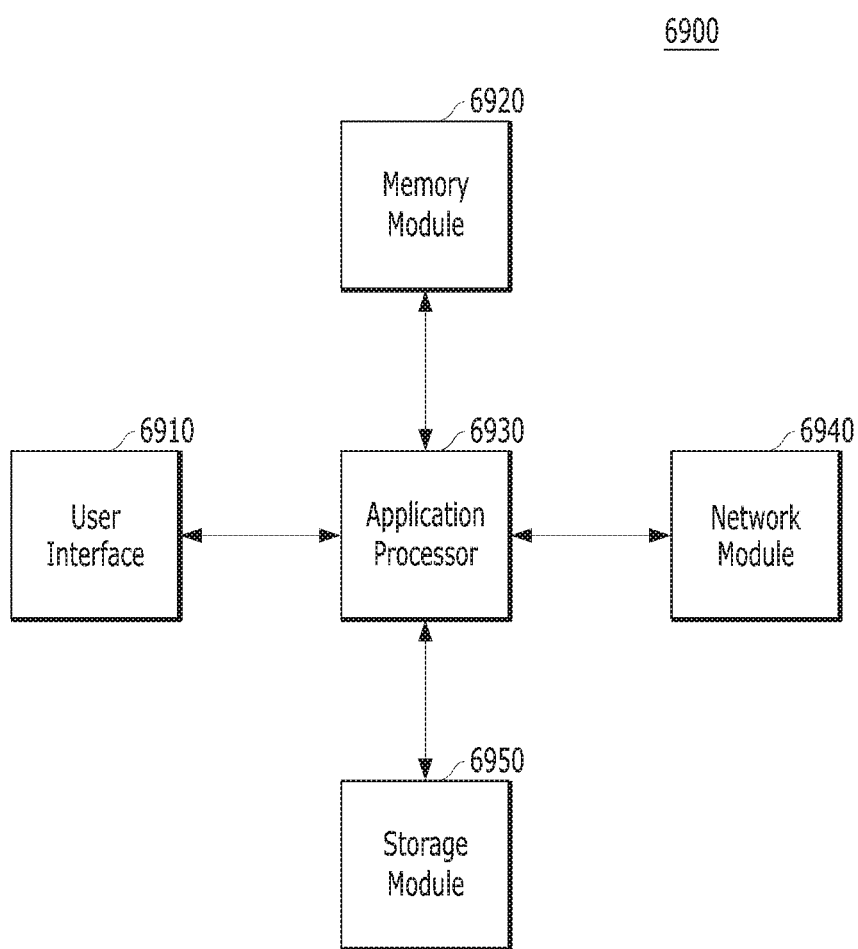

FIG. 23 is a diagram illustrating a data processing system including a memory system in accordance with an embodiment. FIG. 23 illustrates a user system 6900 to which the memory system is applied.

Referring to FIG. 23, the user system 6900 includes a user interface 6910, a memory module 6920, an application processor 6930, a network module 6940, and a storage module 6950.

The application processor 6930 drives components included in the user system 6900 and an operating system (OS). For example, the application processor 6930 may include controllers for controlling the components included in the user system 6900, interfaces, graphics engines, and so on. The application processor 6930 may be provided by a system-on-chip (SoC).

The memory module 6920 may operate as a main memory, a working memory, a buffer memory or a cache memory of the user system 6900. The memory module 6920 may include a volatile random access memory such as a DRAM, an SDRAM, a DDR SDRAM, a DDR2 SDRAM, a DDR3 SDRAM, an LPDDR SDRAM, an LPDDR2 SDRAM and an LPDDR3 SDRAM or a nonvolatile random access memory such as a PRAM, an ReRAM, an MRAM and an FRAM. For example, the application processor 6930 and the memory module 6920 may be mounted by being packaged on the basis of a package-on-package (PoP).

The network module 6940 may communicate with external devices. For example, the network module 6940 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), and the like, and may thereby communicate with wired and/or wireless electronic appliances, particularly a mobile electronic appliance. Thus, the memory system and the data processing system may be applied to wired and/or wireless electronic appliances. The network module 6940 may be included in the application processor 6930.

The storage module 6950 may store data, for example, data received from the application processor 6930, and transmit data stored therein, to the application processor 6930. The storage module 6950 may be implemented by a nonvolatile memory such as a phase-change RAM (PRAM), a magnetic RAM (MRAM), a resistive RAM (ReRAM), a NAND flash memory, a NOR flash memory and a 3-dimensional NAND flash memory. Also, the storage module 6900 may be provided as a removable storage medium such as a memory card of the user system 6900 and an external drive. That is to say, the storage module 6950 may correspond to the memory system 110 described above with reference to FIG. 1, and may be implemented as the SSD, eMMC and UFS described above with reference to FIGS. 17 to 19.

The user interface 6910 may include interfaces for inputting data or commands to the application processor 6930 or for outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

In the case where the memory system 110 described above with reference to FIG. 1 is applied to the mobile electronic appliance of the user system 6900 in accordance with an embodiment, the application processor 6930 controls general operations of the mobile electronic appliance, and the network module 6940 as a communication module controls wired and/or wireless communication with an external device, as described above. The user interface 6910 as the display and touch module of the mobile electronic appliance displays data processed by the application processor 6930 or supports input of data from a touch panel.

According to embodiments of the present invention, a data processing system and a method for operating the data processing system may have minimal complexity and performance deterioration by efficiently synchronizing a NAND mapping table included in a memory device with a host mapping table included in a host.

In accordance with embodiments, the decoding method can perform two-bit weighted bit flipping (WBF) to thereby improve the decoding performance. Furthermore, the decoding method can effectively remove a trapping set to cause a high error floor.

Although various embodiments have been illustrated and described, it will be apparent to those skilled in the art in light of the present disclosure that various changes and modifications may be made without departing from the spirit and scope of the invention as defined in the following claims.

What is claimed is:

1. A decoding method for a low density parity check (LDPC) code in a memory system having a controller, comprising:

resetting an iteration number and first reliability values $q_n$ of a plurality of variable nodes $v_n$;

calculating hard-decision values of the plurality of variable nodes $v_n$ from a received signal, and deciding a hard-decision vector;

transferring the hard-decision vector and the first reliability values $q_n$ to a plurality of check nodes $c_n$;

calculating syndrome values $s_m$ for the plurality of check nodes using the hard-decision vector, and deciding a syndrome vector value $\bar{s}$;

calculating second reliability values $r_{mn}$ corresponding to the syndrome values $s_m$ for the plurality of check nodes using the first reliability values $q_n$, when the syndrome vector value $\bar{s}$ is not 0;

calculating weights $w_{mn}$ for the plurality of variable nodes connected to each of the check nodes using the second reliability values $r_{mn}$;

calculating flipping function values $E_n^{(l)}$ of the plurality of variable nodes using the weights $w_{mn}$;

calculating a flipped flipping function value $-E_n^{(l)}$ by flipping the bit of the variable node having the largest flipping function value among the flipping function values $E_n^{(l)}$ of the plurality of variable nodes;

calculating a reliability function value $D_n^{(l)}$ using the flipping function value of the variable node of which the bit value is flipped; and comparing the reliability function value $D_n^{(l)}$ to a threshold value $\eta$, and updating the first reliability value $q_n$ of the variable node of which the bit value is flipped.

2. The decoding method of claim 1, wherein the resetting of the first reliabilities of the plurality of variable nodes comprises setting each of the first reliability values for the plurality of variable nodes to a high or a low reliability value.

3. The decoding method of claim 1, wherein the calculating of the second reliability values $r_{mn}$ of the syndrome values $s_m$ for the respective check nodes using the first reliability values $q_n$ comprises calculating the second reliability values $r_{mn}$ of the syndrome values, by performing an OR operation on the first reliability values $q_{n'}$ of other variable nodes excluding a variable node to receive the second reliability value $r_{mn}$, among variable nodes connected to any one check node among the plurality of check nodes.

4. The decoding method of claim 3, wherein the second reliability value $r_{mn}$ is calculated through the following equation:

$$r_{mn} = \begin{cases} 1, & \sum_{n' \in N(m) \backslash n} q_{n'} \geq 1 \\ 0, & \text{otherwise} \end{cases},$$

where n' represents the other variable nodes, and $$\sum_{n' \in N(m)\setminus n} q_{n'} \geq 1$$

is calculated by performing an OR operation on the first reliability values $q_{n'}$ of the other variable nodes.

5. The decoding method of claim 1, wherein in the calculating of the weights $w_{mn}$ for the plurality of variable nodes connected to each of the check nodes using the second reliability value $r_{mn}$,
the weights $w_{mn}$ are calculated through the following equation:

$$w_{mn} = \begin{cases} \alpha_s & \text{for } r_{mn} = 0 \\ \alpha_w & \text{for } r_{mn} = 1 \end{cases},$$

where $\alpha_z$ and $\alpha_w$ represent weight factors which are decided according to the second reliability value $r_{mn}$, the value of $\alpha_w$ is fixed to 1, and the value of $\alpha_s$ is expressed as $\alpha_s = 2 \cdot (d_v - 1)$ where $d_v$ represents the variable node degree for each column.

6. The decoding method of claim 1, wherein in the calculating of the flipping function values $E_n^{(l)}$ of the plurality of variable nodes using the weights $w_{mn}$,
the flipping function values $E_n^{(l)}$ of the respective variable nodes are calculated through the following equation:

$$E_n^{(l)} = \sum_{m \in M(n)} w_{mn}(2s_m - 1),$$

where l represents an iteration number.

7. The decoding method of claim 1, wherein in the calculating of the variable node having the largest flipping function value among the flipping function values $E_n^{(l)}$ of the plurality of variable nodes,
the variable node having the largest flipping function value is calculated through the following equation:

$$B = \left\{ n \mid n = \arg\max_n E_n^{(l)} \right\},$$

where B represents a set in which the variable node having the largest flipping function value calculated through $$n = \arg\max_n E_n^{(l)}$$

among the flipping function values $E_n^{(l)}$ of the plurality of variable nodes is stored.

8. The decoding method of claim 1, wherein in the flipping of the bit of the variable node having the largest flipping function value,
the flipping function value $-E_n^{(l)}$ of the variable node of which the bit value is flipped is updated through the following equation:

$$E_n^{(l)} \leftarrow -E_n^{(l)} \text{ for } \forall n \in B.$$

9. The decoding method of claim 1, wherein in the calculating of the reliability function value $D_n^{(l)}$ using the flipping function value of the variable node of which the bit value is flipped, the reliability function value $D_n^{(l)}$ is calculated through the following equation:

$$D_n^{(l)} = E_n^{(l)} + E_n^{(l-1)},$$

where $E_n^{(l-1)}$ represents the flipping function value calculated at the previous iteration number.

10. The decoding method of claim 1, wherein the comparing of the reliability function value $D_n^{(l)}$ to the threshold value $\eta$ and the updating of the first reliability value $q_n$ of the variable node of which the bit value is flipped comprises:
calculating the first reliability value $q_n$ as 1 to update the first reliability value $q_n$ of the variable node of which the bit value is flipped, when the reliability function value $D_n^{(l)}$ is larger than a threshold value $\eta$; and
calculating the first reliability value $q_n$ as 0 to update the first reliability value $q_n$ of the variable node of which the bit value is flipped, when the reliability function value $D_n$ (l) is smaller than the threshold value $\eta$.

11. The decoding method of claim 10, wherein in the comparing of the reliability function value $D_n^{(l)}$ to the threshold value $\eta$ and the updating of the first reliability value $q_n$ of the variable node of which the bit value is flipped,
the first reliability value $q_n$ of the variable node of which the bit value is flipped is calculated through the following equation:

$$q_n = \begin{cases} 1, & D_n^{(l)} \geq \eta \\ 0, & \text{otherwise} \end{cases}$$

$$\eta = \begin{cases} \eta_0, & \ell = 1 \\ \eta_1, & \ell > 1 \end{cases}.$$

12. The decoding method of claim 11, wherein the threshold value $\eta$ is one of a first threshold value $\eta_0$ and a second threshold value $\eta_1$, depending on the iteration number l.

13. The decoding method of claim 12, wherein when l=1, the threshold value $\eta$ is the first threshold value $\eta_0$,
wherein the first threshold value $\eta_0$ is calculated through the following equation:

$$+(d_v - 2) \cdot \alpha_w - 2\alpha_w < \eta_0 < +(d_v - 1) \cdot \alpha_w - \alpha_w.$$

14. The decoding method of claim 12, wherein when l≥2, the threshold value $\eta$ is the second threshold value $\eta_1$,
wherein the second threshold value $\eta_1$ is decided to minimize the weighted sum of conditional decision error probabilities, and the weighted sum of conditional decision error probabilities is expressed as the following equation:

$$+\min_{\eta_1} \beta Pr[q_n = 0 \mid n \in \mathcal{N}_e, DF] + (1-\beta)Pr[q_n = 1 \mid n \in \mathcal{N}_c, DF] =$$

$$\min_{\eta_1} \beta Pr[D_n > \eta_1 \mid n \in \mathcal{N}_e, DF] + (1-\beta)Pr[D_n < \eta_1 \mid n \in \mathcal{N}_c, DF],$$

where $N_e$ represents a set of variable nodes which are errors, $N_c$ represents a set of variable nodes which are not errors, and DF represents decoding failure.

15. The decoding method of claim 1, further comprising checking whether the iteration number l is equal to a maximum number of iterations $l_{max}$, after comparing the reliability function value $D_n^{(l)}$ to the threshold value $\eta$ and updating of the first reliability value $q_n$ of the variable node of which the bit value is flipped, wherein when the iteration number l is equal to the maximum number of iterations $l_{max}$, it is determined that the LDPC code failed to be decoded, and when the iteration number l is smaller than the maximum number of iterations $l_{max}$, the iteration number l is increased by 1 to perform decoding again from the calculating of the hard-decision vector.

16. The decoding method of claim 1, wherein the decoding method performs decoding using a two-bit weighted bit flipping algorithm (TB-WBFA).

17. A decoding method for a low density parity check (LDPC) code, comprising:
   updating a first check node, among a plurality of check nodes, by
   receiving, by the first check node, a bit decision and an associated first reliability value from each of a subset of variable nodes including a first variable node among a plurality of variable nodes,
   calculating a syndrome value and a second reliability value of the first check node based on the received bit decisions and first reliability values, and
   outputting the calculated syndrome value and second reliability value of the first check node to a variable node of the plurality of variable nodes but not of the subset of variable nodes; and
   updating the first variable node by
   receiving, by the first variable node, a syndrome value and a second reliability value of a second check node among the plurality of check nodes, and
   updating the first reliability value of the first variable node based on the syndrome value and the second reliability value of the second check node.

* * * * *